United States Patent
Yaguchi

(10) Patent No.: US 7,164,286 B2
(45) Date of Patent: Jan. 16, 2007

(54) DEVICE AND METHOD FOR MATCHING OUTPUT IMPEDANCE IN SIGNAL TRANSMISSION SYSTEM

(75) Inventor: Yoshitaka Yaguchi, Takatsuki (JP)

(73) Assignee: Matsushita Electric Industrial Co., Ltd., Kadoma (JP)

( * ) Notice: Subject to any disclaimer, the term of this patent is extended or adjusted under 35 U.S.C. 154(b) by 0 days.

(21) Appl. No.: 10/560,797

(22) PCT Filed: Jun. 18, 2004

(86) PCT No.: PCT/JP2004/008962

§ 371 (c)(1),
(2), (4) Date: Dec. 15, 2005

(87) PCT Pub. No.: WO2004/114522

PCT Pub. Date: Dec. 29, 2004

(65) Prior Publication Data

US 2006/0250158 A1    Nov. 9, 2006

(30) Foreign Application Priority Data

Jun. 24, 2003   (JP) .............................. 2003-179738

(51) Int. Cl.
*H03K 19/003* (2006.01)
(52) U.S. Cl. .......................................... 326/30; 326/31
(58) Field of Classification Search ............ 326/30–31, 326/33–34, 26–27
See application file for complete search history.

(56) References Cited

U.S. PATENT DOCUMENTS

| | | | |
|---|---|---|---|
| 5,585,741 A | 12/1996 | Jordan | |
| 6,487,250 B1 | 11/2002 | Kato et al. | |
| 2001/0015882 A1 | 8/2001 | Yanagawa | |

FOREIGN PATENT DOCUMENTS

| | | |
|---|---|---|
| JP | 10-50070 | 2/1998 |
| JP | 10-261948 | 9/1998 |
| JP | 11-017518 | 1/1999 |
| JP | 2001-127614 | 5/2001 |
| JP | 2003-008419 | 1/2003 |
| JP | 2003-008421 | 1/2003 |

OTHER PUBLICATIONS

International Search Report for corresponding Application No. PCT/JP2004/008962, mailed Jul. 27, 2004.

*Primary Examiner*—James H. Cho
(74) *Attorney, Agent, or Firm*—Renner, Otto, Boisselle & Sklar, LLP

(57) ABSTRACT

A signal transmission system includes a transmitter and a receiver connected via a transmission line. When a control circuit 103 in the transmitter 200 outputs a test signal to a transmission line 123, a voltage detection section 112 in the receiver 210 determines whether a voltage value on a terminal 115 falls within a given range or not. Based on the result, the control signal generation section 113 generates an instruction as to whether or not to change the current amount of the driving current. The control circuit 103 in the transmitter 100 drives the transmission line 123 with the driving current increased or decreased based on the instruction, and again outputs a test signal. This process is repeated until the voltage on the terminal 115 of the receiver 210 comes into the range. As a result, an optimum output impedance for the control circuit 103 of the transmitter 200 can be obtained. When transmitting a signal via the line, matching is dynamically established between the output impedance of the driving circuit and that of the line, whereby a fast signal transmission can be realized.

60 Claims, 7 Drawing Sheets

(a)

(b)

DEVICE AND METHOD FOR MATCHING OUTPUT IMPEDANCE IN SIGNAL TRANSMISSION SYSTEM

TECHNICAL FIELD

The present invention relates to a technique of, when transmitting a signal between devices which are connected via a transmission line, establishing matching between the output impedance of a driving circuit for driving the transmission line and the impedance of the transmission line. In particular, the present invention relates to a technique of output impedance adjustment for reducing waveform distortion caused by reflection at the time of signal transmission, and transmission of a waveform distortion detection signal.

BACKGROUND ART

When transmitting a signal between home appliances which are connected via a cable, or between semiconductor integrated circuits on a board that are connected via printed wiring, it is necessary to establish matching between the output impedance of the driving circuit and the impedance of the transmission line. The reason is that, if matching is not established, waveform distortion will occur due to reflection of the transmitted signal, thus hindering correct transmission of the signal. Furthermore, extra time is required until the signal reflection becomes subsided, thus making fast signal transmission difficult.

Conventionally, various methods for establishing matching between the output impedance of a driving circuit at the signal-transmitting end and the impedance of a transmission line have been known. Japanese Laid-Open Patent Publication No. 2003-8419, Japanese Laid-Open Patent Publication No. 10-261948, and Japanese Laid-Open Patent Publication No. 11-17518 describe techniques of establishing impedance matching when transmitting a signal between semiconductor integrated circuits. To describe the content of Japanese Laid-Open Patent Publication No. 2003-8419 as an example, separately in addition to a transmission line used for actual signal transmission, a reference transmission line is provided in loop fashion and terminated at the semiconductor integrated circuit which outputs a signal, the reference transmission line having equivalent characteristics to those of the transmission line. By utilizing the reference transmission line to establish matching between the output impedance of the driving circuit and the impedance of the transmission line, it is considered that impedance matching is also established with respect to the actual transmission line.

However, the conventional impedance matching techniques have various problems.

A first problem is that there may be an error between the characteristics of the transmission line which is used for transmitting an actual signal and the characteristics of the reference transmission line. In the case where the transmission line is a printed wiring board, naturally, the transmission line used for transmitting an actual signal and the reference transmission line are to be disposed at different positions on the printed wiring board. Even on the same printed wiring board, depending on the position, there may be variations in the characteristics (dielectric constant and the like) which determine impedance. Therefore, even if impedance matching is established by using the reference transmission line, optimal matching cannot be guaranteed with respect to the impedance of the actual transmission line. In other words, even by using the reference transmission line, it is difficult to determine the optimum impedance of the actual transmission line.

A second problem is that, since the reference transmission line must be provided separately in addition to the transmission line used for transmitting an actual signal, increases in area and volume may result. Especially in the case where there are plural signal transmission lines, and where precise impedance matching must be established, the same number or a close number of reference wiring patterns will have to be provided corresponding to the plural transmission lines, thus resulting in a great increase in wiring area. Such would be contrary to the trend for chip downsizing in the recent years, and therefore is impractical.

A third problem is that the aforementioned impedance matching techniques are not applicable to impedance matching between home appliance devices which are connected via a cable. In the case where a personal computer (PC) and a USB device are to be connected via a USB cable, for example, it will be impossible and impractical to provide a reference transmission line. Moreover, since the home appliance devices to be connected are diversified and it is impossible to establish impedance matching in advance, it will be necessary to establish impedance matching in a dynamic manner upon each connection. Especially in the case where signals are to be rapidly transmitted between home appliance devices, if matching between the impedance of a driving circuit and the impedance of a cable cannot be established, fast transmission may not be possible depending on the particular cable used, thus detracting from reliability.

An objective of the present invention is to, when transmitting a signal via a transmission line, establish matching between the output impedance of a driving circuit and the impedance of the transmission line in a dynamic manner, thus realizing fast signal transmission and improving transmission efficiency. Another objective of the present invention is to adapt the power consumption at the time of signal transmission to the transmission line, thus reducing power consumption to the bear minimum.

DISCLOSURE OF INVENTION

A transmitter according to the present invention is to be connected to a receiver via a transmission line, the transmitter composing a signal transmission system together with the receiver. The transmitter includes: a communication section to be connected to a first end of the transmission line; and a driving current control section for driving the transmission line with a predetermined amount of driving current, the driving current control section changing the current amount of the driving current based on a control signal. As the control signal, the communication section receives from the receiver being connected to a second end of the transmission line an instruction signal for instructing whether or not to change the current amount of the driving current, the instruction signal being generated based on whether a signal value detected at the second end of the transmission line falls within a predetermined range or not. Thus, the aforementioned objectives are attained.

If the signal value falls within the predetermined range, the communication section may receive as the control signal an instruction signal instructing to stop changing the current amount of the driving current, and based on the control signal, the driving current control section may retain a present setting value of the current amount of the driving current.

If the signal value is smaller than a lower limit value of the predetermined range, the communication section may receive as the control signal an instruction signal instructing to increase the driving current, and based on the control signal, the driving current control section may increase the driving current.

If the signal value is greater than an upper limit value of the predetermined range, the communication section may receive as the control signal an instruction signal instructing to decrease the driving current, and based on the control signal, the driving current control section may decrease the driving current.

The communication section may include a first terminal connected to the first end of the transmission line and a second terminal for being connected to a control signal line to receive the instruction signal, the control signal line being different from the transmission line.

The driving current control section may be capable of transmitting a signal by driving the transmission line; and transmission of a signal from the driving current control section and reception of the control signal may be performed by time division.

An output impedance value when the driving current control section drives the transmission line may be smaller than an output impedance value of the receiver outputting the instruction signal.

The driving current control section may be capable of transmitting a signal by driving the transmission line; and a rate with which the driving current control section transmits a signal may be faster than a rate with which a signal is transmitted when the receiver outputs the instruction signal.

The transmission line may be detachable from the communication section.

A receiver according to the present invention is to be connected to a transmitter via a transmission line, the receiver composing a signal transmission system together with the transmitter. The transmitter is connected to a first end of the transmission line. The receiver includes: a communication section connected to a second end of the transmission line, the communication section receiving a signal from the transmission line being driven with a predetermined driving current; a detection section for detecting a signal value at the second end of the transmission line based on the signal, and for generating a detection signal indicating whether the signal value falls within a predetermined range or not; and a signal generation section for, based on the detection signal, generating an instruction signal for instructing whether or not to change the current amount of the driving current. The communication section outputs the instruction signal to the transmitter. Thus, the aforementioned objectives are attained.

If a detection signal indicating that the signal value falls within the predetermined range is generated by the detection section, the signal generation section may generate an instruction signal instructing to stop changing the current amount of the driving current.

If a detection signal indicating that the signal value is smaller than a lower limit value of the predetermined range is generated by the detection section, the signal generation section may generate an instruction signal instructing to increase the driving current.

If a detection signal indicating that the signal value is greater than an upper limit value of the predetermined range is generated by the detection section, the signal generation section may generate an instruction signal instructing to decrease the driving current.

The communication section may include a first terminal connected to the second end of the transmission line and a second terminal for being connected to a control signal line to output the instruction signal, the control signal line being different from the transmission line.

The transmitter may be capable of transmitting a signal by driving the transmission line with the predetermined driving current; and reception of a signal from the transmission line and transmission of the instruction signal may be performed by time division.

An output impedance value of the transmitter driving the transmission line with the predetermined driving current may be smaller than an output impedance value from the terminal portion to the signal generation section.

A rate with which a signal is transmitted when the receiver outputs the instruction signal may be slower than a rate with which the driving current control section transmits a signal by driving the transmission line.

The transmission line may be detachable from the communication section.

A transmitting-end interface according to the present invention is to be used in a transmitter to be connected to a receiving-end interface of a receiver via a transmission line, the transmitter composing a signal transmission system together with the receiver. The transmitting-end interface includes: a communication section to be connected to a first end of the transmission line; and a driving current control section for driving the transmission line with a predetermined amount of driving current, the driving current control section changing the current amount of the driving current based on a control signal. As the control signal, the communication section receives from the receiver being connected to a second end of the transmission line an instruction signal for instructing whether or not to change the current amount of the driving current, the instruction signal being generated based on whether a signal value detected at the second end of the transmission line falls within a predetermined range or not. Thus, the aforementioned objectives are attained.

The communication section may include a first terminal connected to the first end of the transmission line and a second terminal for being connected to a control signal line to receive the instruction signal, the control signal line being different from the transmission line.

The driving current control section may be capable of transmitting a signal by driving the transmission line; and transmission of a signal from the driving current control section and reception of the control signal may be performed by time division.

An output impedance value when the driving current control section drives the transmission line may be smaller than an output impedance value of the receiver outputting the instruction signal.

The driving current control section may be capable of transmitting a signal by driving the transmission line; and a rate with which the driving current control section transmits a signal may be faster than a rate with which a signal is transmitted when the receiver outputs the instruction signal.

A receiving-end interface according to the present invention is to be used in a receiver to be connected to a transmitting-end interface of a transmitter via a transmission line, the receiver composing a signal transmission system together with the transmitter. The transmitting-end interface is connected to a first end of the transmission line. The receiving-end interface includes: a communication section connected to a second end of the transmission line, the communication section receiving a signal from the transmission line being driven with a predetermined driving current; a detection section for detecting a signal value at the second end of the transmission line based on the signal received at the communication section, and for generating a detection signal indicating whether the signal value falls within a predetermined range or not; and a signal generation section for, based on the detection signal, generating an instruction signal for instructing whether or not to change the current amount of the driving current. The communication section outputs the instruction signal to the transmitter. Thus, the aforementioned objectives are attained.

The communication section may include a first terminal connected to the second end of the transmission line and a second terminal for being connected to a control signal line to output the instruction signal, the control signal line being different from the transmission line.

The transmitter may be capable of transmitting a signal by driving the transmission line with the predetermined driving current; and reception of a signal from the transmission line and transmission of the instruction signal may be performed by time division.

An output impedance value of the transmitter driving the transmission line with the predetermined driving current may be smaller than an output impedance value from the terminal portion to the signal generation section.

A rate with which a signal is transmitted when the receiving-end interface outputs the instruction signal may be slower than a rate with which the driving current control section transmits a signal by driving the transmission line.

An interface system comprising the aforementioned transmitting-end interface and the aforementioned receiving-end interface may be constructed, wherein the transmitting-end interface and the receiving-end interface are connected via the transmission line.

A transmitting-end chip according to the present invention is to be connected to a receiving-end chip via a transmission line, the transmitting-end chip composing a signal transmission system together with the receiving-end chip. The transmitting-end chip includes: a communication section to be connected to a first end of the transmission line; and a driving current control section for driving the transmission line with a predetermined amount of driving current, the driving current control section changing the current amount of the driving current based on a control signal. As the control signal, the communication section receives from the receiver being connected to a second end of the transmission line an instruction signal for instructing whether or not to change the current amount of the driving current, the instruction signal being generated based on whether a signal value detected at the second end of the transmission line falls within a predetermined range or not. Thus, the aforementioned objectives are attained.

The communication section may include a first terminal connected to the first end of the transmission line and a second terminal for being connected to a control signal line to receive the instruction signal, the control signal line being different from the transmission line.

The driving current control section may be capable of transmitting a signal by driving the transmission line; and transmission of a signal from the driving current control section and reception of the control signal may be performed by time division.

An output impedance value when the driving current control section drives the transmission line may be smaller than an output impedance value of the receiver outputting the instruction signal.

The driving current control section may be capable of transmitting a signal by driving the transmission line; and a rate with which the driving current control section transmits a signal may be faster than a rate with which a signal is transmitted when the receiver outputs the instruction signal.

A receiving-end chip according to the present invention is to be connected to a transmitting-end chip via a transmission line, the receiving-end chip composing a signal transmission system together with the transmitting-end chip. The transmitting-end chip is connected to a first end of the transmission line. The receiving-end chip includes: a communication section connected to a second end of the transmission line, the communication section receiving a signal from the transmission line being driven with a predetermined driving current; a detection section for detecting a signal value at the second end of the transmission line based on the signal, and for generating a detection signal indicating whether the signal value falls within a predetermined range or not; and a signal generation section for, based on the detection signal received at the communication section, generating an instruction signal for instructing whether or not to change the current amount of the driving current. The communication section outputs the instruction signal to the transmitter. Thus, the aforementioned objectives are attained.

The communication section may include a first terminal connected to the second end of the transmission line and a second terminal for being connected to a control signal line to output the instruction signal, the control signal line being different from the transmission line.

The transmitter may be capable of transmitting a signal by driving the transmission line with the predetermined driving current; and reception of a signal from the transmission line and transmission of the instruction signal may be performed by time division.

An output impedance value of the transmitter driving the transmission line with the predetermined driving current may be smaller than an output impedance value from the terminal portion to the signal generation section.

A rate with which a signal is transmitted when the receiving-end chip outputs the instruction signal may be slower than a rate with which the driving current control section transmits a signal by driving the transmission line.

A chip-mounted board comprising the aforementioned transmitting-end chip and the aforementioned receiving-end chip may be constructed, wherein the transmitting-end chip and the receiving-end chip are connected via the transmission line.

An output impedance setting method according to the present invention sets an output impedance of a transmitter which is connected to a receiver via a transmission line and composes a signal transmission system together with the receiver. The transmitter includes: a communication section to be connected to a first end of the transmission line; and a driving current control section for driving the transmission line, the receiver being connected to a second end of the transmission line. The method includes the steps of: operating the driving current control section to drive the transmission line with a predetermined amount of driving current; receiving, as a control signal for instructing whether or not to change the current amount of the driving current, an instruction signal generated based on whether a signal value detected at the second end of the transmission line falls within a predetermined range or not; and changing the current amount of the driving current based on the control signal. Thus, the aforementioned objectives are attained.

The communication section may include a first terminal connected to the first end of the transmission line and a second terminal connected to a control signal line, the control signal line being different from the transmission line; and the step of receiving may receive the instruction signal at the second terminal.

The step of driving may operate the driving current control section to transmit a signal by driving the transmission line, and a step of performing, by time division, transmission of a signal from the driving current control section and reception of the control signal may be further comprised.

An output impedance value when the driving current control section drives the transmission line may be smaller than an output impedance value of the receiver outputting the instruction signal.

The step of driving may operate the driving current control section to transmit a signal by driving the transmission line; and a rate with which the driving current control section transmits a signal may be faster than a rate with which a signal is transmitted when the receiver outputs the instruction signal.

An output impedance setting, assisting method according to the present invention is to be used in a receiver which is connected to a transmitter via a transmission line and composes a signal transmission system together with the transmitter. The transmitter is connected to a first end of the transmission line, the receiver including: a communication section connected to a second end of the transmission line; and a detection section for detecting a signal value at a predetermined position. The method includes the steps of: receiving, via the communication section, a signal from the transmission line being driven with a predetermined driving current; detecting, by using the detection section, a signal value at the second end of the transmission line based on the signal; generating a detection signal indicating whether the signal value falls within a predetermined range or not; based on the detection signal, determining whether or not to change the current amount of the driving current with which the transmission line is driven; generating an instruction signal indicating the result of determination; and outputting the instruction signal to the transmitter via the communication section. Thus, the aforementioned objectives are attained.

The communication section may include a first terminal connected to the second end of the transmission line and a second terminal connected to a control signal line, the control signal line being different from the transmission line; and the step of receiving may receive the instruction signal at the second terminal.

The transmitter may be capable of transmitting a signal by driving the transmission line with the predetermined driving current, and a step of performing, by time division, reception of a signal from the transmission line and transmission of the instruction signal may be further comprised.

An output impedance value of the transmitter driving the transmission line with the predetermined driving current may be smaller than an output impedance value from the terminal portion to the signal generation section.

A rate with which a signal is transmitted when the receiver outputs the instruction signal may be slower than a rate with which the driving current control section transmits a signal by driving the transmission line.

A computer program according to the present invention is to be executed in a transmitter which is connected to a receiver via a transmission line and composes a signal transmission system together with the receiver. The transmitter includes: a communication section to be connected to a first end of the transmission line; and a driving current control section for driving the transmission line, the receiver being connected to a second end of the transmission line. The computer program includes the steps of: operating the driving current control section to drive the transmission line with a predetermined amount of driving current; receiving of causing the communication section to receive, as a control signal for instructing whether or not to change the current amount of the driving current, an instruction signal generated at the receiver based on whether a signal value detected at the second end of the transmission line falls within a predetermined range or not; and changing the current amount of the driving current based on the control signal. Thus, the aforementioned objectives are attained.

The communication section may include a first terminal connected to the first end of the transmission line and a second terminal connected to a control signal line, the control signal line being different from the transmission line; and the instruction signal may be received at the second terminal.

The driving current control section may be capable of transmitting a signal by driving the transmission line, and the transmitter may be caused to perform, by time division, transmission of a signal from the driving current control section and reception of the control signal.

An output impedance value when the driving current control section drives the transmission line may be smaller than an output impedance value of the receiver outputting the instruction signal.

The driving current control section may be capable of transmitting a signal by driving the transmission line; and a rate with which the driving current control section transmits a signal may be faster than a rate with which a signal is transmitted when the receiver outputs the instruction signal.

A computer program according to the present invention is to be executed in a receiver which is connected to a transmitter via a transmission line and composes a signal transmission system together with the transmitter. The transmitter is connected to a first end of the transmission line, the receiver including: a communication section connected to a second end of the transmission line; and a detection section for detecting a signal value at a predetermined position. The computer program includes the steps of: receiving, via the communication section, a signal from the transmission line being driven with a predetermined driving current; detecting, by using the detection section, a signal value at the second end of the transmission line based on the signal; generating a detection signal indicating whether the signal value falls within a predetermined range or not; based on the detection signal, determining whether or not to change the current amount of the driving current with which the transmission line is driven; generating an instruction signal indicating the result of determination; and outputting the instruction signal to the transmitter via the communication section. Thus, the aforementioned objectives are attained.

The communication section may include a first terminal connected to the second end of the transmission line and a second terminal connected to a control signal line, the control signal line being different from the transmission line; and the instruction signal may be received at the second terminal.

The transmitter may be capable of transmitting a signal by driving the transmission line with the predetermined driving current, and the receiver may be caused to perform, by time division, reception of a signal from the transmission line and transmission of the instruction signal.

An output impedance value of the transmitter driving the transmission line with the predetermined driving current may be smaller than an output impedance value from the terminal portion to the signal generation section.

A rate with which a signal is transmitted when the receiver outputs the instruction signal may be slower than a rate with which the driving current control section transmits a signal by driving the transmission line.

BEST MODE FOR CARRYING OUT THE INVENTION

Hereinafter, with respect to the accompanying drawings, embodiments of an impedance matching process according to the present invention will be described.

(Embodiment 1)

Figure 1:
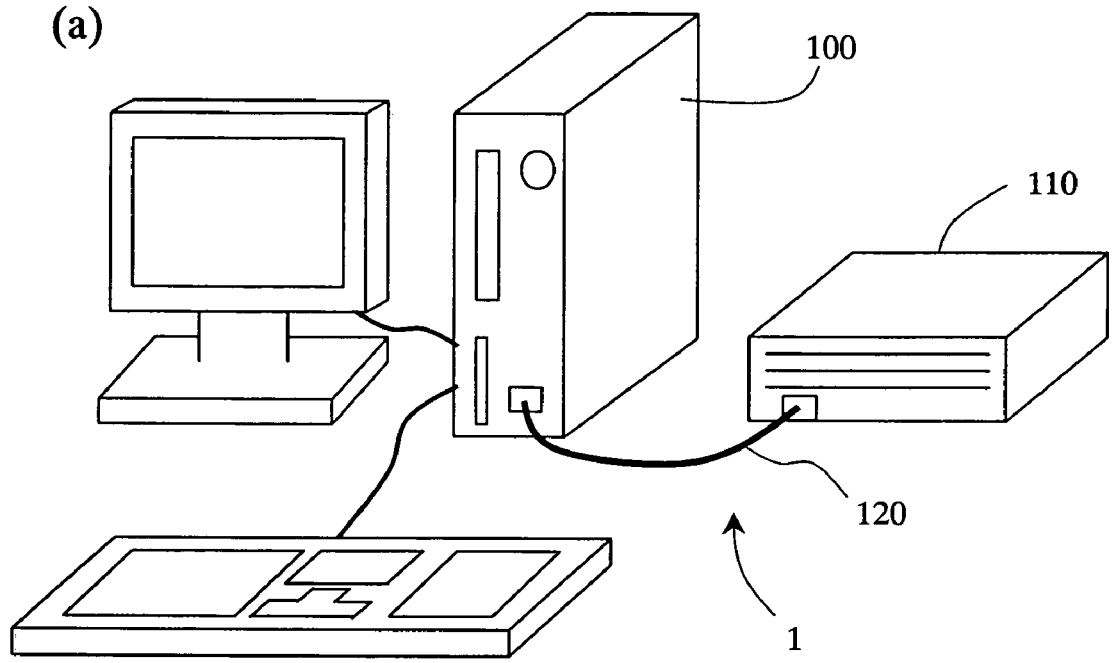
FIGS. 1(a) and (b) show variations of signal transmission systems 1, where (a) is a diagram showing the constitution of a signal transmission system 1 having a PC 100 and a hard disk drive 110.
FIG. 1(b) is a diagram showing the constitution of a signal transmission system 1 on a printed wiring board, which includes a plurality of semiconductor integrated circuits 100 and 110.
Figure 1:
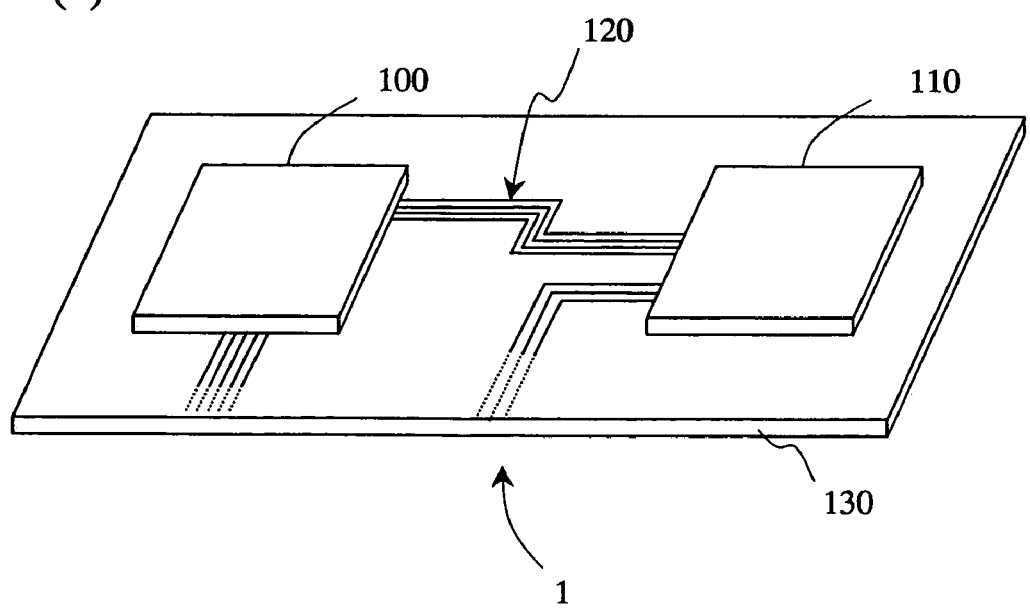

FIGS. 1(a) and (b) show variations of signal transmission systems 1, to which the impedance matching process according to the present embodiment is applicable.

FIG. 1(a) shows the constitution of a signal transmission system 1 including a PC 100 and a hard disk drive 110. Herein, it is assumed that the PC 100 and the hard disk drive 110 each has an interface based on the USB2.0 standard.

When a USB cable 120 is inserted in connectors of the PC 100 and the hard disk drive 110, connection is established in accordance with a procedure based on the USB2.0 standard. Once the PC 100 and the hard disk drive 110 are connected via the USB cable 120, the signal transmission system 1 is constructed.

After the signal transmission system 1 is constructed, based on a process according to the present embodiment, the PC 100 and the hard disk drive 110 establish matching between the output impedance of a driving current control circuit (not shown) which is provided in the interface of the signal-transmitting device (PC 100) and the impedance of the USB cable 120. Since a signal is also transmitted from the hard disk drive 110 to the PC 100, matching is similarly established between the output impedance of a driving current control circuit which is provided in the interface of the signal-transmitting device (hard disk drive 110) and the impedance of the USB cable 120. Thereafter, based on a scheme compliant with the USB2.0 standard, signals are exchanged between the PC 100 and the hard disk drive 110 at a transmission speed of 480 Mbps, for example.

FIG. 1(a) illustrates an exemplary case where the signal transmission system 1 is constructed by using the PC 100 and the hard disk drive 110. However, instead of a PC and a hard disk drive, various other types of devices, e.g., a digital camera, a DVD drive, and the like, may be used to construct the signal transmission system 1. Moreover, FIG. 1(a) illustrates an exemplary case where the signal transmission system 1 is constructed via connection based on the USB2.0 standard, using the USB cable 120 as a transmission line. However, instead of the USB2.0 standard, any other communication standard or protocol, e.g., the IEEE1394 standard, SCSI standard, or HDMI (High-Definition Multimedia Interface) standard, may be used to construct the signal transmission system 1.

FIG. 1(b) shows the constitution of a signal transmission system 1 where a plurality of semiconductor integrated circuits 100 and 110 are provided on a printed wiring board. In the figure, semiconductor integrated circuits 100 and 110 are semiconductor chips. Once the semiconductor integrated circuit 100 and the semiconductor integrated circuit 110 are connected to each other via a printed wiring 120, which is a transmission line, the signal transmission system 1 is constructed. The semiconductor integrated circuits 100 and 110 perform a below-described process to establish matching between the impedance of the driving current control circuit (not shown) of the semiconductor integrated circuit 100 or 110 and the impedance of the printed wiring 120. Similarly to FIG. 1(a), if a driving current control circuit is provided in each of the semiconductor integrated circuits 100 and 110, matching is to be established between the output impedance of each and the impedance of the printed wiring 120. As a result, it becomes possible to perform a fast signal transmission between the semiconductor integrated circuit 100 and the semiconductor integrated circuit 110 via the printed wiring 120, whereby transmission efficiency is improved.

FIG. 1(b) illustrates an example where the signal transmission system 1 is constructed from the semiconductor integrated circuits 100 and 110 on a printed wiring board. However, a signal transmission system 1 can also be constructed between specific circuits which are integrated on a single chip.

In either one of the signal transmission systems 1 shown in FIGS. 1(a) and (b), after establishing impedance matching, impedance matching processes are repetitively executed at a predetermined time interval (e.g., at an interval of several seconds to several tens of seconds), thus being able to re-establish impedance matching in a dynamic manner. As a result, impedance mismatching occurring due to changes in the supplied source voltage, temperature changes, and the like can be eliminated.

Moreover, in the signal transmission system 1 shown in FIGS. 1(a) and (b), the impedance matching process according to the present embodiment is to be performed between the PC and the hard disk drive, and between the semiconductor integrated circuits. More specifically, however, the respective interface sections which are provided in the PC, the hard disk drive, and the semiconductor integrated circuits perform the matching process. Such interfaces are capable of executing the process according to the present embodiment, and are able to form the interface system 1, which is a signal transmission system.

Hereinafter, the constitution and process for executing the process of establishing impedance matching according to the present embodiment will be described.

First, the constitution of the signal transmission system 1 will be described with reference to FIG. 2. As described above, various implementations are possible for the signal transmission system 1. Therefore, the descriptions below will assume that the signal transmission system 1 includes a transmitter 100 which transmits a signal and a receiver 110 which receives a signal. However, that is not to say that the transmitter 100 is unable to receive a signal. The transmitter 100 may include the function of the receiver 110, and the receiver 110 may include the function of the transmitter 100. Moreover, the signal transmission system 1 may include three or more devices. In that case, FIG. 2 can be regarded as illustrating specific two of transmitters and receivers which perform signal exchange.

Figure 2:
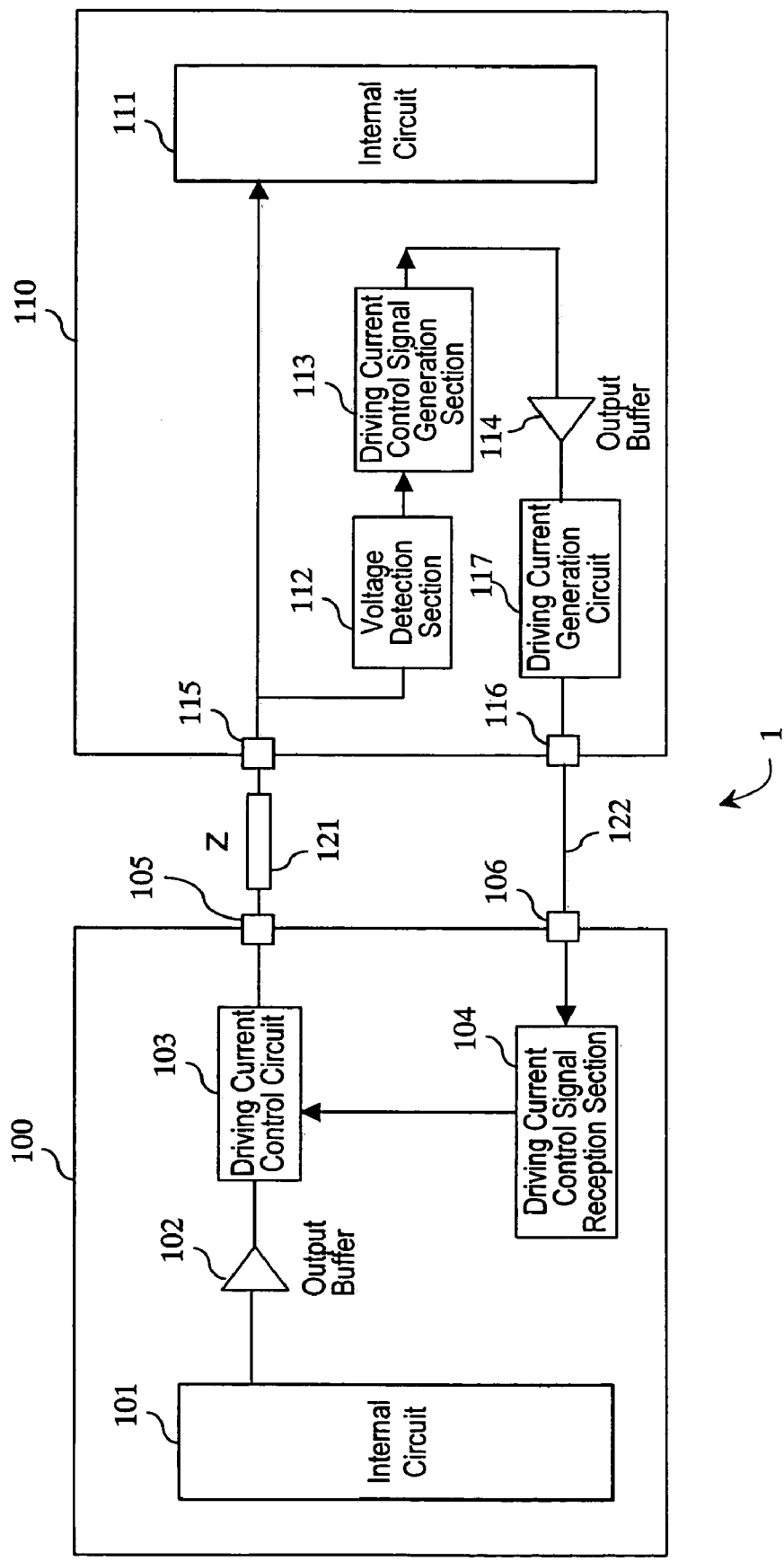
FIG. 2 is a block diagram showing the functional constitution of a signal transmission system 1 according to Embodiment 1.

FIG. 2 shows the structure of the functional block of the signal transmission system 1 according to the present embodiment. The signal transmission system 1 includes a transmitter 100 and a receiver 110. The transmitter 100 and the receiver 110 are connected via two transmission lines 121 and 122 which transmit different signals. Between these transmission lines, the value of an impedance Z which is defined with respect to the transmission line 121 exerts an influence when rapidly transmitting a signal from the transmitter 100 to the receiver 110. On the other hand, the transmission line 122 is utilized as a control signal line for transmitting a control signal from the receiver 110 to the transmitter 100. The signal transmission via the transmission line 122 is slower than the signal transmission which is performed via the transmission line 121. Therefore, the waveform distortion which occurs due to reflection of the signal transmitted, and the time which is required until signal reflection becomes subsided, are not as problematic as in the case of fast transmission. In other words, the impedance present in the transmission line 122 is not a particular problem. Note that the transmission lines 121 and 122 may be realized as a single cable in which a plurality of transmission lines are bundled together.

Hereinafter, the respective constituent elements of the transmitter 100 will be described, and thereafter the respective constituent elements of the receiver 110 will be described.

The transmitter 100 includes an internal circuit 101, an output buffer 102, a driving current control circuit 103, a driving current control signal reception section 104, a signal output terminal 105, and a signal input terminal 106.

The internal circuit 101 is a circuit which realizes functions that are specific to the transmitter 100, and outputs a signal to be transmitted to the receiver 110, and the like. For example, in the case where the transmitter 100 is the PC in FIG. 1(*a*), the internal circuit 101 may broadly be a CPU, a memory, or any other semiconductor chip, etc., mounted on a mother board. Furthermore, in the case where the transmitter 100 is a device (an interface card or the like) whose main function is an interfacing function, the internal circuit 101 is a circuit for securing connection with a device in which the circuit 101 is implemented. Moreover, in the case where the transmitter 100 is a semiconductor integrated circuit in FIG. 1(*b*), the internal circuit 101 is a calculation circuit or the like which performs predetermined calculations.

The internal circuit 101 sends a predetermined test pattern signal to the output buffer 102. The output buffer 102 temporarily stores the signal which has been output from the internal circuit 101, and outputs a signal which repetitively changes between a low level and a high level.

The driving current control circuit (hereinafter referred to as the "control circuit") 103 drives the transmission line 121 with a predetermined driving current, thus outputting onto the transmission line 121 a signal which is in accordance with the signal having been output from the output buffer 102. Moreover, the control circuit 103 receives the control signal, and changes the current amount of the driving current based on the control signal. The specific constitution of the control circuit 103 will be described later with reference to FIG. 3.

The driving current control signal reception section (hereinafter referred to as the "reception section") 104 receives a signal which is received at the signal input terminal 106, subjects it to a predetermined conversion, and outputs a control signal. The signal received by the reception section 104 is an instruction signal from an external device (the receiver 110) designating a predetermined operation, and the signal output therefrom is a control signal for controlling the operations of the constituent elements in the transmitter 100. The specific constitution of the reception section 104 will be described later with reference to FIG. 4.

The signal output terminal 105 and the signal input terminal 106 are communication sections, each of which directly outputs and receives a signal when the transmitter 100 performs external communications. The signal output terminal 105 is connected to one end of the transmission line 121. The signal output terminal 105 outputs the signal from the control circuit 103 onto the transmission line 121. Moreover, the signal input terminal 106 is connected to one end of the transmission line 122. The signal input terminal 106 receives a signal via the transmission line 122.

Next, the constitution of the receiver 110 will be described. The receiver 110 includes an internal circuit 111, a voltage detection section 112, a driving current control signal generation section 113, an output buffer 114, a signal input terminal 115, a signal output terminal 116, and a driving current generation circuit 117.

The internal circuit 111 is circuitry for realizing functions that are specific to the receiver 110, and processes a signal which is received from the transmitter 100. For example, in the case where the receiver 110 is the hard disk drive in FIG. 1(*a*), the internal circuit 111 may broadly be a signal processing LSI for a hard disk drive, a buffer, a driving circuit for an access arm or a spindle motor, and the like. Furthermore, in the case where the receiver 110 is a device (an interface card or the like) whose main function is an interfacing function, the internal circuit 111 is a circuit for securing connection with a device in which the circuit 111 is implemented. Moreover, in the case where the receiver 110 is a semiconductor integrated circuit in FIG. 1(*b*), the internal circuit 111 is a calculation circuit or the like which performs predetermined calculations.

The voltage detection section 112 detects a voltage value on the signal input terminal 115 with a certain timing based on changes in the input voltage, and generates one or more voltage detection signals which indicate whether the voltage value falls within a predetermined range or not. The predetermined range is defined by at least two determination reference values. For example, the voltage detection signals include a signal indicating whether it is greater than a first determination reference value or not, and a signal indicating whether it is greater than a second determination reference value or not. As a result, it is possible to determine whether the voltage value falls within that range or the voltage is greater or smaller than that range. The specific constitution of the voltage detection section 112 will be described later with reference to FIG. 5. Although FIG. 2 illustrates the voltage detection section 112 as directly detecting the voltage on the signal input terminal 115, the voltage detection section 112 does not need to detect the voltage directly. Moreover, any other electrical characteristics of the transmission line 121 besides the voltage value, e.g., an electric power value, a current value, or the like, may be detected.

The driving current control signal generation section (hereinafter referred to as the "control signal generation section") 113 receives the voltage detection signals, and generates an instruction signal based on these signals. The instruction signal is a signal for instructing the control circuit 103 of the transmitter 100 whether or not to change the current amount of the driving current. The specific constitution of the control signal generation section 113 will be described later with reference to FIG. 5. The output buffer 114 temporarily stores the signal which is output from the internal circuit 101, and outputs it to the driving current generation circuit 117.

The driving current generation circuit 117 receives the instruction signal from the output buffer 114, and drives the transmission line 122 with a predetermined driving current, thus outputting the instruction signal.

The signal input terminal 115 and the signal output terminal 116 are communication sections, each of which directly receives and outputs a signal when the receiver 110 performs external communications. The signal input terminal 115 is connected to another end of the transmission line 121, and receives a signal via the transmission line 121. The signal output terminal 116 is connected to another end of the transmission line 122. The signal output terminal 116 outputs the signal from the driving current generation circuit 117 onto the transmission line 122.

Next, a more specific constitution of each of the above-described constituent elements will be described.

Figure 3:
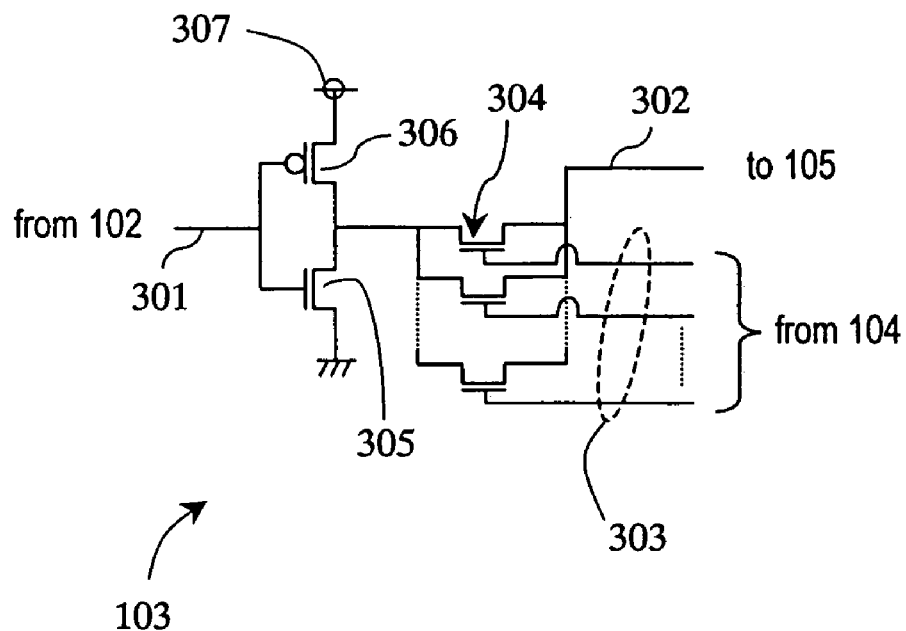
FIG. 3 is a circuit diagram of a driving current control circuit 103 of a transmitter 100.

FIG. 3 shows a circuit constitution of the control circuit 103 of the transmitter 100. The control circuit 103 receives on a signal line 301 a signal which has been output from the output buffer 102, and outputs from a signal line 302 a signal having a timing which is defined in accordance with that signal.

The control circuit 103 includes control signal input terminals 303, output driving ability adjustment transistors 304, a Low voltage output transistor 305, a High voltage output transistor 306, and a power source 307. The signal line 301 is connected to gate electrodes of the transistors 305 and 306. The output driving ability adjustment transistors 304 is connected in series to the Low voltage output transistor 305 and the High voltage output transistor 306. To the output driving ability adjustment transistors 304, a ground voltage or the voltage of the power source 307 is applied at the source electrodes of the transistors 304, depending on whether the signal applied to the signal line 301 is at a high level or a low level. The respective gate electrodes of the transistors 304 are connected to the control signal input terminals 303, and a control signal from the reception section 104 is applied thereto. The control signal is parallel signals which are individually input to the respective transistors 304. As a result, any transistor among the transistors 304 can be selectively on or off. The voltage on the drain electrode of any transistor that has been turned on is equal to the voltage of the power source 307 or the ground voltage. Moreover, a predetermined current is output via the signal line 302. Based on the above operation principle, the number of transistors to conduct is controlled in the control circuit 103 based on the control signal, thus making it possible to change the output impedance of the control circuit 103. Note that, the driving ability of the control circuit 103 is prescribed so as to have an adjustment range which is equal to or greater than the impedance widths of various transmission lines which are expected to be actually driven.

Figure 4:
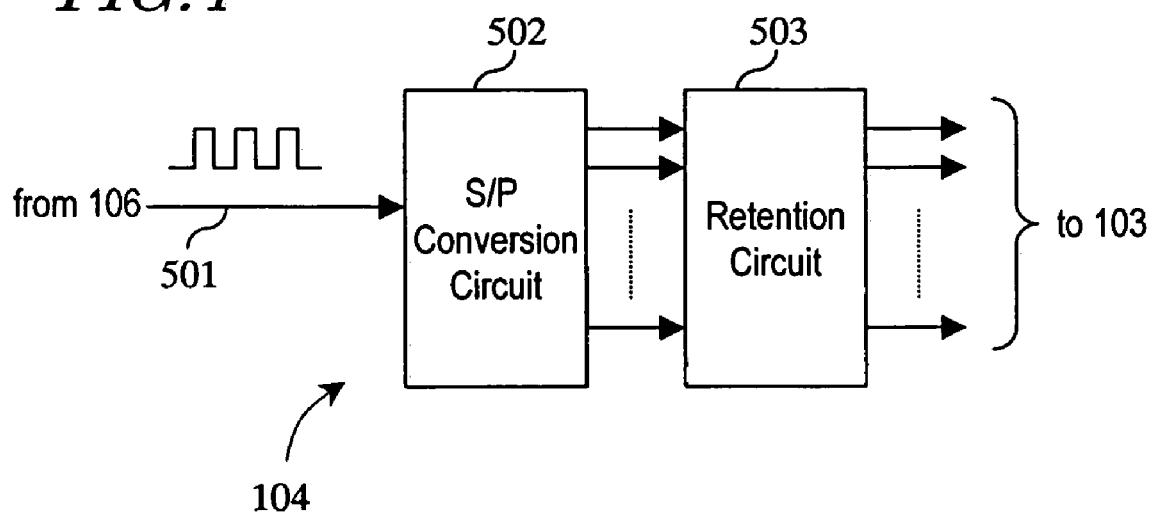
FIG. 4 is a block diagram showing the constitution of a driving current control signal reception section 104.

Next, FIG. 4 shows a block constitution of the reception section 104. A signal line 501 transmits a serial data signal 501 which is received via the signal input terminal 106. A serial/parallel conversion circuit (hereinafter referred to as the "S/P conversion circuit") 502 converts serial data into parallel data. The retention circuit 503 retains this parallel data, and outputs the retained parallel data. The parallel data is output to the control signal input terminals 303 of the control circuit 103 as a control signal.

Figure 5:
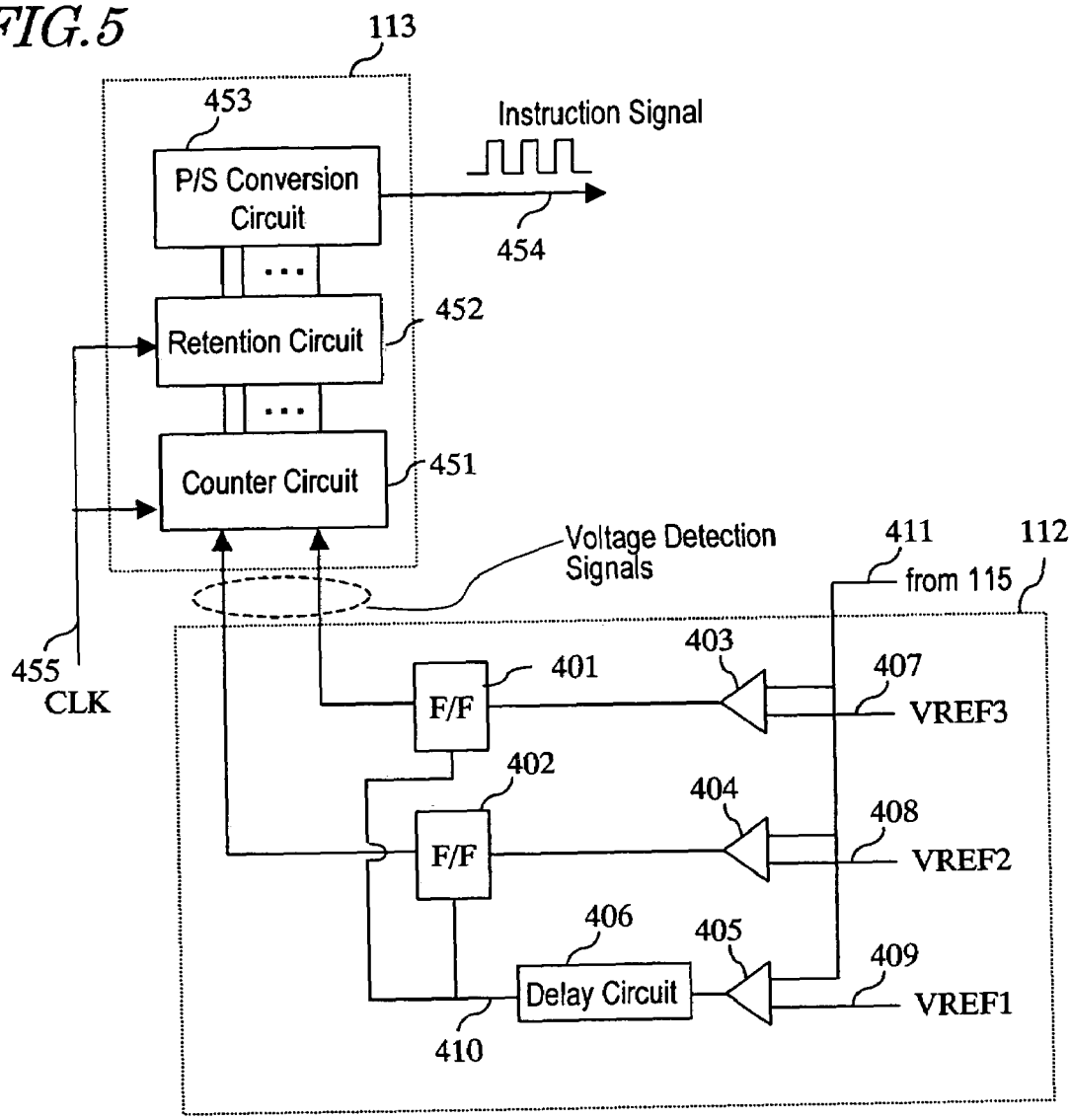
FIG. 5 is a block diagram showing the constitution of a voltage detection section 112 and a driving current control signal generation section 113 of a receiver 110.

FIG. 5 shows a functional block constitution of the voltage detection section 112 and the control signal generation section 113 of the receiver 110. Firstly, the voltage detection section 112 includes flip-flops (hereinafter referred to as the F/Fs) 401 and 402, comparators 403, 404, and 405, and a delay circuit 406. Via a signal line 411, the voltage detection section 112 receives a signal on the transmission line 121 at the signal input terminal 115. The comparators 403, 404, and 405 are connected in parallel to the signal line 411, and simultaneously receive the signal on the signal input terminal 115. The comparators 403, 404, and 405 also receive reference voltages VREF1, VREF2, and VREF3, via signal lines 407, 408, and 409, respectively. It is assumed herein that VREF1<VREF2<VREF3. The comparator 403 compares the voltage value of the incoming signal against the reference voltage VREF1, and outputs whichever signal is greater. As the reference voltage VREF1, for example, an earliest lowest initial voltage at the input end may be calculated from the expected impedance width of the transmission line 121 and impedance variable range of the driving current control circuit, and determined as the greatest voltage in a range which allows detection of its amplitude. Similarly, the comparators 404 and 405 compare the voltage of the incoming signal against the reference voltage VREF2 and compare the voltage of the incoming signal against VREF3, and each output whichever signal is greater.

The reference voltages VREF2 and VREF3 can be determined in relation to the driving performance of the transmitter 100 to which the receiver 110 is to be connected. Specifically, VREF2 and VREF3 are prescribed so that VREF2<V<VREF3, given a voltage V of the power source 307 of the control circuit 103 (FIG. 3). Since the driving voltage of any connectable transmitter 100 is known in advance, it is possible to set the values of the reference voltages VREF2 and VREF3 at the time of manufacture, etc., of the receiver 110. Note that the values of the reference voltages VREF1 to 3 may be externally input.

The outputs of the comparators 403 and 404 are connected to the flip-flops 401 and 402 (hereinafter referred to as "F/Fs"). The F/Fs 401 and 402 operate based on a sampling signal which is output from the delay circuit 406. Upon receiving a signal having a voltage which is equal to or greater than the reference voltage VREF1, the delay circuit 406 retains the signal for a predetermined time and then outputs the signal. In other words, the input is delayed before being output. This output is the sampling signal. Based on the sampling signal, the F/Fs 401 and 402 will have "0" set thereto when the voltage received via the signal line 411 is smaller than the reference voltage, and "1" when greater. The values set in the F/Fs 401 and 402 are output as voltage detection signals.

The outputs from the F/Fs 401 and 402 are input to a retention circuit 452 via a counter circuit 451 which is inside the control signal generation section 113, and further the outputs from the retention circuit 452 is input to a parallel/serial conversion circuit (hereinafter referred to as the P/S conversion circuit) 453. More specifically, the counter circuit 451 in the control signal generation section 113 receives the voltage detection signals which are output from the voltage detection section 112, and operates as follows. If the outputs of the F/Fs 401 and 402 are "0","0", the counter circuit 451 generates an instruction signal for increasing the number of transistors to be driven, by one, among the transistors 304 which are provided in the control circuit 103. Conversely, if the outputs of the F/Fs 401 and 402 are "1","1", it generates an instruction signal for decreasing the number of transistors to be driven, by one, among the transistors 304 which are provided in the control circuit 103. Moreover, if the outputs of the F/Fs 401 and 402 are "0","1", it outputs a signal for stopping the driving ability control operation of the control circuit 103. The instruction signal which has been output is retained in the retention circuit 452, and then output. The P/S conversion circuit 453 converts the instruction signal having been output from the retention circuit 452 into a serial data signal, and outputs it onto a signal line 454.

Figure 6:
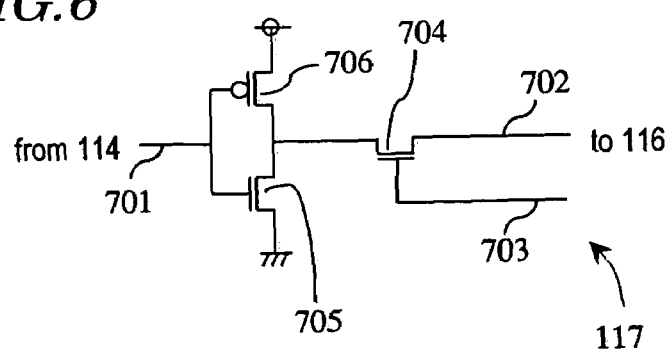
FIG. 6 is a circuit diagram showing the constitution of a driving current generation circuit 117.

Next, FIG. 6 shows the circuit constitution of the driving current generation circuit 117. Similarly to the control circuit 103, the driving current generation circuit 117 is provided in order to drive a transmission line; therefore, its constitution is similar to the constitution of the control circuit 103. Unlike the control circuit 103, one transistor 704 is provided as an output stage transistor. The reason why there is one transistor 704, as opposed to a plurality of them, is that there is no need to fine-adjust the current value which is necessary for driving the transmission line 122. A gate electrode of the transistor 704 is connected to a control signal input terminal 703, such that the output transistor 704 can be switched between an on; state and an off state based on a signal which is input to the terminal 703. Herein, however, the on state is always maintained. Note that gate electrodes of the transistors 705 and 706 are connected to a signal line 701 so that the output voltage is changed when an output signal from the output buffer 114 is applied, such constitution being similar to that of the control circuit 103. Moreover, the output transistor 704 is connected in series to the Low voltage output transistor 705 and the High voltage output transistor 706, such constitution also being similar to that of the control circuit 103. The driving current generation circuit 117 drives the transmission line 122 with a predetermined driving current, thus outputting an instruction signal via the signal output terminal 116. As described above, the instruction signal is converted at the reception section 104 of the transmitter 100 into parallel data so as to be utilized as a control signal.

Figure 7:
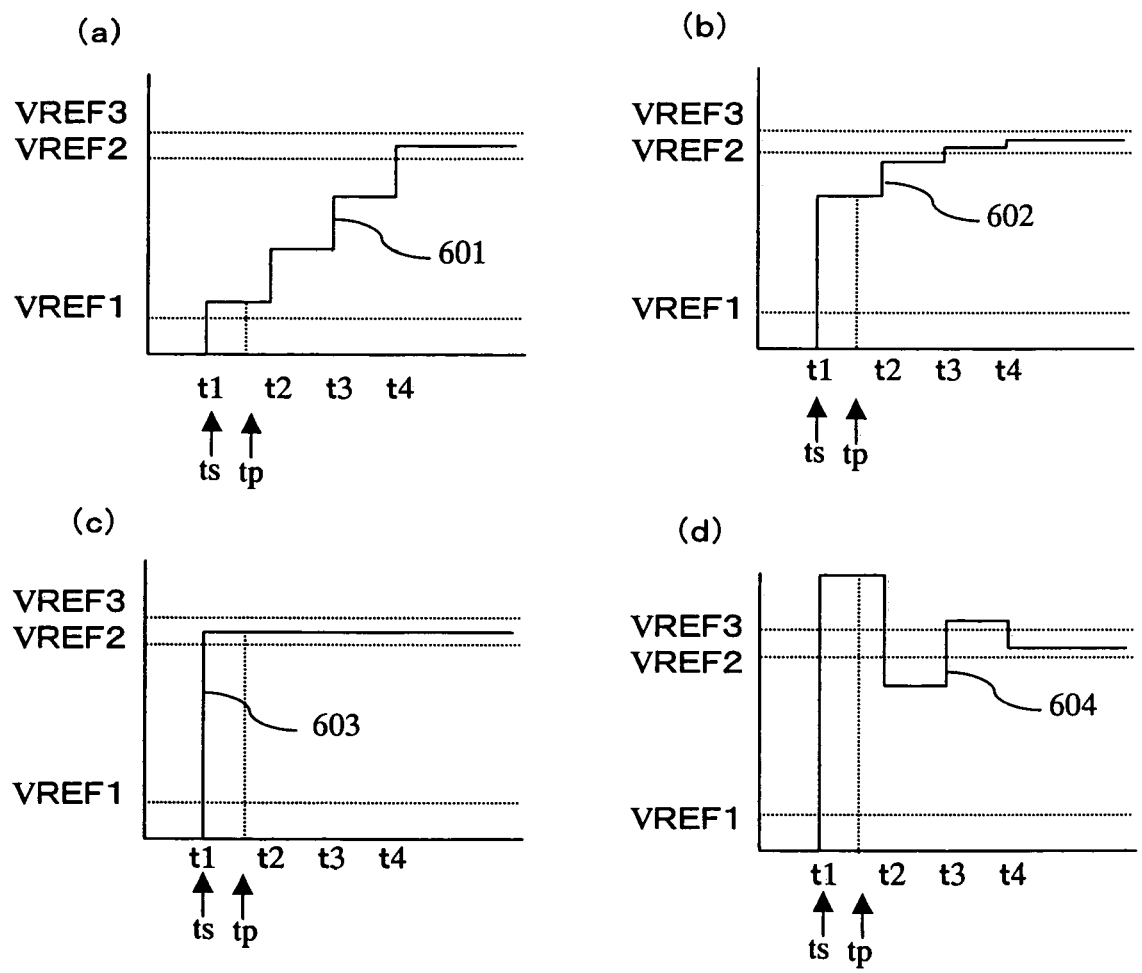
FIGS. 7(a) to (d) are diagrams showing transient voltage waveforms at the receiver 110 side, which are in accordance with the relationship between the output impedance of the driving current control circuit 103 and the impedance of the transmission line 121.

Now, with reference to FIG. 7, the influence which the driving ability (output impedance) of the driving current output circuit 103 exerts on the distortion of the transmission signal waveform will be described, and an operation which is required of the control circuit 103 in view of this influence will be described.

FIGS. 7(a) to (d) are diagrams showing transient voltage waveforms at the receiver 110 side, which are in accordance with the relationship between the output impedance of the driving current control circuit 103 and the impedance of the transmission line 121. Items which are common to FIGS. 7(a) to (d) will be described. Firstly, time ts is a point in time at which the reference voltage VREF1 is first exceeded on the signal input terminal 115. Time tp is a point in time after the lapse of a predetermined time from time ts. A "predetermined time" is a time by which the delay circuit 406 in the voltage detection section 112 shown in FIG. 5 delays its output.

FIG. 7(a) shows a transient voltage waveform 601 on the signal input terminal 115 in the case where the output impedance value of the driving current output circuit 103 is greater than the impedance value of the transmission line 121. Voltage measurement begins at time tp. The voltage at time tp (hereinafter referred to as the "initial voltage" at the input end) is below the reference voltages VREF2 and VREF3. The voltage detection section 112 sequentially detects voltage at times t2, t3 and t4, until detecting, at time t4, the voltage falling into the range defined by the reference voltages VREF2 and VREF3. For example, in the case where the transmission frequency is 1 GHz, the interval between times t1 and t2 is 1 nanosecond. It is assumed that time tp is a point in time between times t1 and t2.

FIG. 7(b) shows a transient voltage waveform 602 on the signal input terminal 115 in the case where the output impedance value is smaller than in FIG. 7(a). By decreasing the output impedance value to increase the driving ability, the reference voltage VREF1 is far exceeded at the initial voltage at the input end, but the reference voltage VREF2 is not reached. The point in time at which the voltages VREF2 and VREF3 are reached is time t3.

FIG. 7(c) shows a transient voltage waveform 603 on the signal input terminal 115 in the case where the output impedance value is smaller than in FIG. 7(b). By further decreasing the output impedance value to increase the driving ability, at time t1, the initial voltage at the input end has reached a voltage which is intermediate between the reference voltages VREF2 and VREF3. At time t1 and later, too, the voltage stays stable. The point in time at which stability is attained is clearly earlier than in the examples of FIGS. 7(a) and (b).

FIG. 7(d) shows a transient voltage waveform 604 on the signal input terminal 115 in the case where the output impedance value is smaller than in FIG. 7(c). The initial voltage at the input end exceeds the reference voltages VREF2 and VREF3 at time t1. However, the voltage conversely becomes lower than the voltage VREF2 at time t2 (hereinafter such a waveform state will be referred to as waveform distortion). Thereafter, the voltage again exceeds the reference voltages VREF2 and VREF3 at time t3, and at time t4 and later, it converges at a voltage which is intermediate between the reference voltages VREF2 and VREF3.

Thus, it can be said that the internal circuit 111 of the receiver 110 is able to receive a signal which is output from the output buffer 102 of the transmitter 100 at the earliest time and with the greatest certainty in the case of the waveform 603 of FIG. 7(c). From the above, it can be said that an optimum transmission waveform is obtained on the signal input terminal 115 if the initial voltage at the input end is a potential which is intermediate between VREF2 and VREF3.

Hereinafter, with reference to FIG. 2 and FIG. 8, an impedance matching process which is performed in the signal transmission system 1 will be described. This process is performed under control of communication controllers (not shown) in the transmitter 100 and the receiver 110, for example. Each communication controller gives instructions to the respective constituent elements by analyzing and executing a program in an EEPROM or the like. The following description will illustrate a process to be executed when, connection between the transmitter 100 and the receiver 110 having been established, a fast signal transmission is begun.

In the present embodiment, the output impedance of the control circuit 103 is set maximum in an initial state which exists before the transmitter 100 begins a signal transmission (e.g., immediately after the power of the transmitter 100 is activated). This is synonymous to making the driving ability minimum. It is assumed that the input impedance on the signal input terminal 115 of the receiver 110 is infinite.

Figure 8:
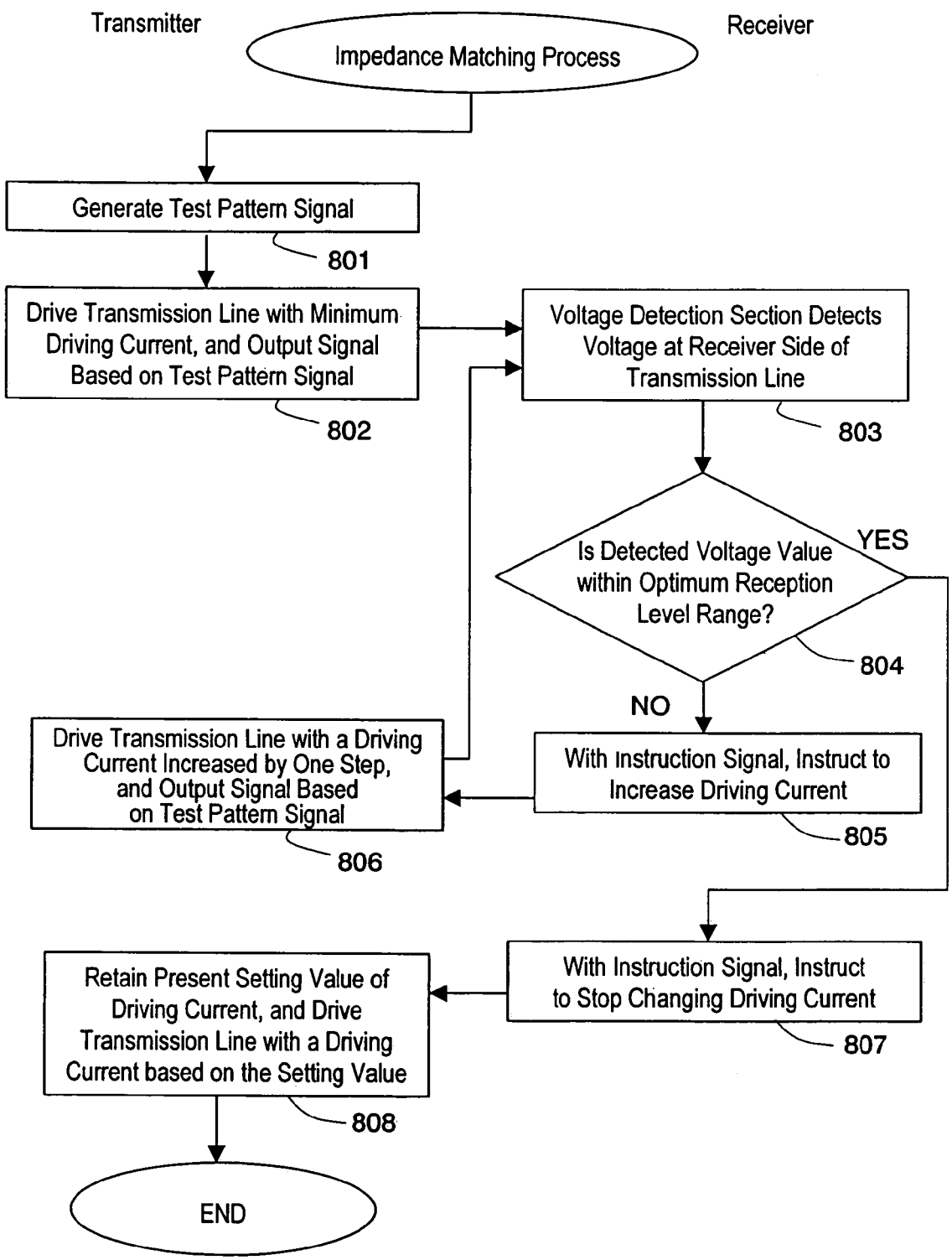
FIG. 8 is a flowchart showing the procedure of an impedance matching process in the signal transmission system 1.

FIG. 8 is a flowchart showing the procedure of an impedance matching process in the signal transmission system 1. Blocks on the left-hand side of the figure are the operation of the transmitter, whereas the blocks on the right-hand side are the operation of the receiver. As will become clear from the following, in the signal transmission system 1, the receiver has a function of assisting in the setting of the output impedance of the transmitter 100.

First, the internal circuit 101 of the transmitter 100 generates a test pattern signal at step 801. Based on this test pattern signal, the output buffer 102 outputs a signal which repetitively switches between a low level and a high level. At step 802, the control circuit 103 first drives the transmission line with a minimum driving current, thus outputting a signal which is based on the test pattern signal.

Then, at step 803, the voltage detection section 112 detects an initial voltage on the signal input terminal 115 of the receiver 110 which is connected to the transmission line 121. The detection is performed at time tp (FIG. 6) which is delayed from ts, i.e., a point in time at which the reference voltage VREF1 is reached responsive to a transition of the output from the low level to the high level.

At step 804, the voltage detection section 112 determines whether the detected voltage value is within the optimum reception level range. This determination is a determination as to whether the waveform and voltage value of the initial voltage on the signal input terminal 115 exhibit a state as shown in FIG. 7(c) or not. If the optimum range as shown in FIG. 7(c) has not been entered, control proceeds to step 805; if the range has been entered, control proceeds to step 807.

At step 805, the two F/Fs 401 and 402 in the voltage detection section 112 output "0" and "0". Based on this output signal, the control signal generation section 113 generates an instruction signal. The instruction signal, which is a signal that instructs to increase the driving current, is sent to the transmitter 100 via the output buffer 114 and the driving current generation circuit 117. The reception section 104 generates a control signal from the received instruction signal, and at step 806, the control circuit 103 drives the transmission line 121 with a driving current which is increased by one step based on the control signal, and again outputs a signal which is based on the test pattern signal. The receiver 110 performs a process of detecting an initial voltage on the signal input terminal 115, and repeats the process from step 803 on.

On the other hand, at step 807, the control signal generation section 113 generates an instruction signal, and instructs the transmitter 100 to stop changing (increasing) the driving current. This means fixing the number of output stage transistors which are currently being driven. The control signal generation section 113 retains data specifying this number in the retention circuit 452 provided in the control circuit, e.g., a flip-flop or a RAM. Note that, at this time, the two F/Fs 401 and 402 in the voltage detection section 112 output "0" and "1", thus indicating that the output impedance of the control circuit 103 has an optimum value.

At step 808, the control circuit 103 retains the present setting value of the current amount of the driving current, and drives the transmission line 121 with a driving current which is based on this setting value. Through the above process, the impedance matching process by the control circuit 103 which is in accordance with the relationship between the output impedance and the impedance of the transmission line 121 is ended.

In the present embodiment, by controlling in the control circuit 103 the number of transistors to conduct, the output impedance of the control circuit 103 is changed until the initial voltage that is detected at the receiver 110 falls into a predetermined range. Once the initial voltage detected at the receiver 110 falls into the predetermined range, the output impedance of the control circuit 103 is set optimally, and it becomes possible to perform transmission of an actual signal with a waveform which is free of distortion, as indicated by the waveform 603 of FIG. 7(c). The transmission lines 121 and 122 may be detachable, e.g., a USB cable, or printed wiring which is affixed on a printed-circuit board.

Thus, an impedance matching process which is performed in the signal transmission system 1 has been described. Although the above description assumes that the output driving ability is adjusted at the rise of a signal, it would also be possible to make an adjustment at the fall of a signal. In this case, the procedure would be similar except that the determination values would be different. Moreover, although the description assumed that the output impedance of the control circuit 103 is maximum (i.e., the driving ability of the transmission line 121 is minimum) at the start of the process, it would also be possible to set the output impedance at minimum (i.e., the driving ability is maximum). In the case where the process is begun with the output impedance in the initial state being set at minimum, the output impedance is to be increased through subsequent control.

Note that the present embodiment employs the P/S conversion circuit 453 and the S/P conversion circuit 502, and serial data is used for the transmission of a driving current control signal. However, it is not limited to serial data. Transmission data of any format may be used so long as the drive reception section 104 is able to receive the output from the retention circuit 452. Furthermore, the above description assumes that the impedance adjustment is performed based on a test pattern signal from the internal circuit 101. However, instead of a test pattern signal, the aforementioned process may be performed by utilizing the rise and fall, etc., of a signal during actual data transfer. For example, when establishing connection between the transmitter 100 and the receiver 110, impedance matching may be realized by utilizing the aforementioned test pattern signal, and after data transmission is begun, impedance matching may be re-established in a dynamic manner by utilizing at least one of the rise and fall of the data which is under transmission, at a predetermined time interval.

(Embodiment 2)

Figure 9:
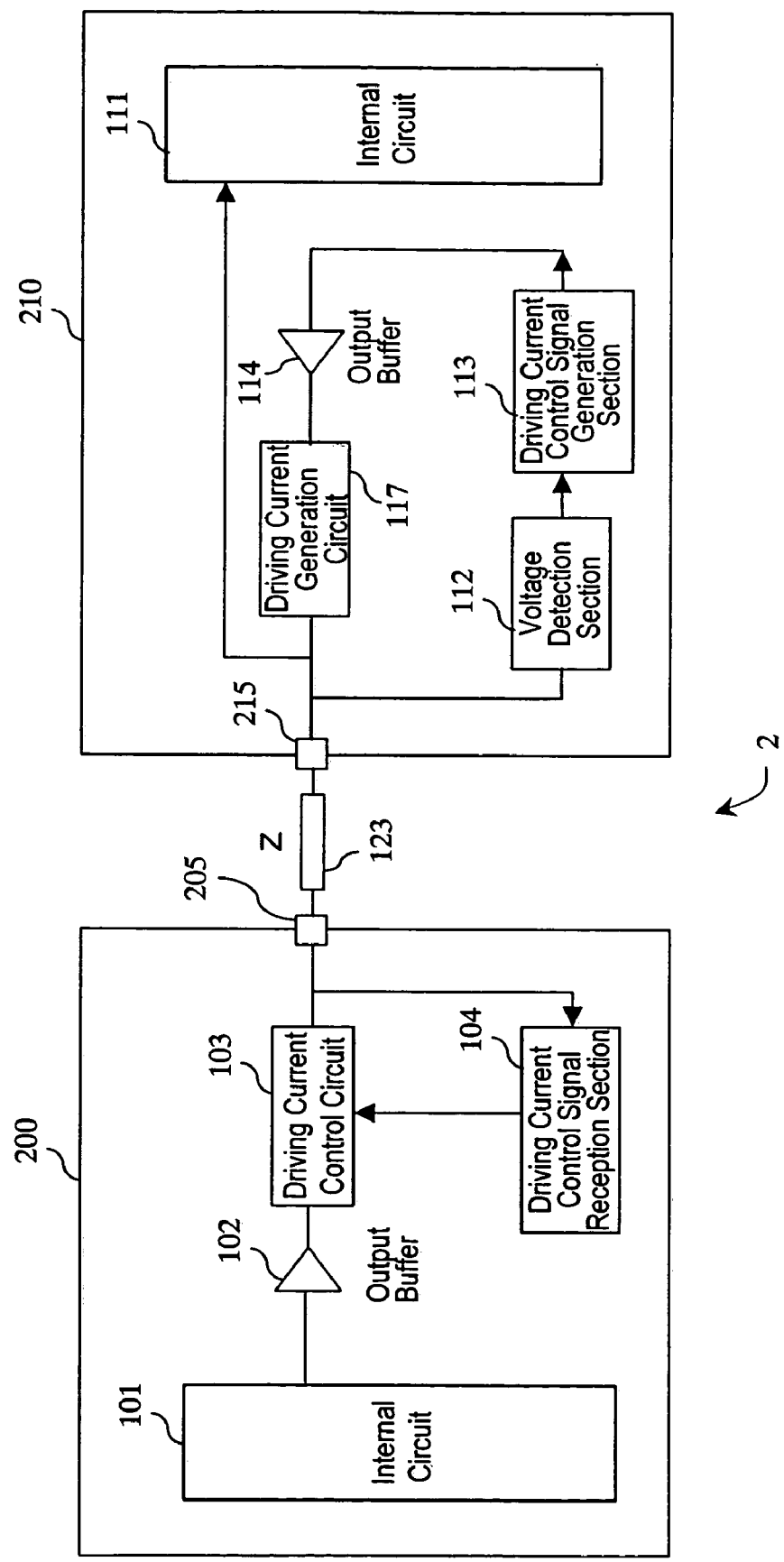
FIG. 9 is a block diagram showing the functional constitution of a signal transmission system 2 according to Embodiment 2.

FIG. 9 shows the structure of functional blocks of signal transmission system 2 according to the present embodiment. As in the signal transmission system 1 according to Embodiment 1, the signal transmission system 2 is also realized in implementations of FIGS. 1(a) and (b). The following description assumes that the signal transmission system 2 includes a transmitter 200 which transmits a signal and a receiver 210 which receives a signal. However, that is not to say that the transmitter 200 is unable to receive a signal. The transmitter 200 may include the function of the receiver 210, and the receiver 210 may include the function of the transmitter 200.

The signal transmission system 2 includes the transmitter 200 and the receiver 210. Unlike the signal transmission system 1 of Embodiment 1, the transmitter 200 and the receiver 210 are connected via a single transmission line 123 which transmits signals. Since the value of an impedance Z which is defined with respect to the transmission line 123 exerts an influence when rapidly transmitting a signal from the transmitter 200 to the receiver 210, it is necessary to establish matching between the output impedance of a driving circuit in the transmitter 200 and the impedance of the transmission line 123.

In the following, the transmitter 200 will be first described, and then the receiver 210 will be described. Among the elements composing the transmitter 200 and the receiver 210, any element that basically has the same function as that of a constituent element in the transmitter 100 and the receiver 110 of FIG. 2 will be denoted by the same reference numeral, and the detailed description thereof will be omitted. Whenever any special description is given, it is to be understood that a function associated with such description is additionally comprised.

The transmitter 200 includes an internal circuit 101, an output buffer 102, a control circuit 103, a reception section 104, and a signal input/output terminal 205. The signal input/output terminal 205 is a communication section which directly exchanges signals when the transmitter 200, performs external communications. The signal input/output terminal 205, which is connected to one end of the transmission line 123, outputs a signal from the control circuit 103 onto the transmission line 123, and receives an instruction signal from the receiver 210 via the transmission line 123.

The receiver 210 includes an internal circuit 111, a voltage detection section 112, a control signal generation section 113, an output buffer 114, a signal input/output terminal 215, a signal output terminal 116, and a driving current generation circuit 117. The signal input/output terminal 215 is a communication section which directly exchanges signals when the transmitter 200 performs external communications. The signal output terminal 215, which is connected to the other end of the transmission line 123, receives a signal from the transmitter 200 via the transmission line 123, and outputs an instruction signal from the driving current generation circuit 117 onto the transmission line 123.

Since the transmitter 200 and the receiver 210 are connected via the single transmission line 123, it is necessary to avoid conflict between signal transmission from the transmitter 200 to the receiver 210 and signal transmission from the receiver 210 to the transmitter 200. In order to avoid conflict, it is necessary to adjust both the signal transmission timing between the devices and the operation timing of the constituent elements of each device.

The signal transmission timing between the devices can be adjusted as follows. For example, the transmitter 200 transmits a signal which is in accordance with a test pattern signal every 1 msec, and the receiver 210 sends an instruction signal to the transmitter 200 during a period in which no signal is being transmitted. In other words, signal transmission and reception are performed by so-called time division. Alternatively, after sending out a signal which is in accordance with a test pattern signal onto the transmission line 123, the transmitter 200 stops the operation of the control circuit 103 until receiving a control signal from the receiver 210.

The operation timing of the constituent elements of each device can be adjusted as follows. For example, when transmitting a signal from the transmitter 200 to the receiver 210, an output transistor 704 inside the driving current generation circuit 117 of the receiver 210 is turned off. As a result, the output of the driving current generation circuit 117 takes a high impedance state, and a voltage which occurs in connection with a signal from the control circuit 103 of the transmitter 200 can be detected at the voltage detection section 112 and the internal circuit 111. On the other hand, when transmitting an instruction signal from the receiver 210 to the transmitter 200, output driving ability adjustment transistors 304 (FIG. 3) inside the control circuit 103 are all turned off. As a result, the output of the control circuit 103 takes a high impedance state, and a signal which is output from the receiver 210 can be received at the reception section 104.

Hereinafter, an impedance matching process which is performed in the signal transmission system 1 will be described. The flow of process is generally the same as in the flowchart of the signal transmission system 1 of Embodiment 1 illustrated in FIG. 8.

In the present embodiment, the output impedance of the control circuit 103 is set to a maximum value in an initial state which exists before the transmitter 200 begins a signal transmission (e.g., immediately after the power of the transmitter 200 is activated). This is synonymous to making the driving ability minimum. Hereinafter, it is assumed that the input impedance on the signal input/output terminal 205 as seen from the transmission line 123 is substantially infinite.

Moreover, at the beginning of the impedance matching process, the receiver 210 has taken a predetermined initial state in order to be able to assist the process of adjusting the output impedance of the transmitter 200. Specifically, at the driving current generation circuit 117 in the receiver 210, the output transistors therein are turned off, and are retained in a high impedance state. The following description assumes that the input impedance at the signal input/output terminal 215 of the receiver 210 is infinite.

The output impedance adjustment sequence is as follows. First, the internal circuit 101 of the transmitter 200 generates a test pattern signal. Based on this test pattern signal, the output buffer 102 outputs a signal which repetitively switches between a low level and a high level. The control circuit 103 first drives the transmission line with a minimum driving current, thus outputting a signal based on the test pattern signal.

On the other hand, the voltage detection section 112 of the receiver 210 detects an initial voltage on the signal input terminal 215 of the receiver 210 which is connected to the transmission line 123. The detection is performed at time tp (FIG. 6) which is delayed from ts, at which the reference voltage VREF1 is reached responsive to a transition of the output from the low level to the high level.

The voltage detection section 112 determines whether the detected voltage value is within the optimum reception level range. If the initial voltage detected by the voltage detection section 112 is lower than the reference voltages VREF2 and VREF3, as is the voltage value at time tp of the waveform 601 shown in FIG. 7(a), two F/Fs 401 and 402 in the voltage detection section 112 output "0" and "0". These outputs indicate that the present driving ability is too low. Upon receiving the "0","0" signals from the voltage detection section 112, the control signal generation section 113 generates in an internal counter circuit 451 an instruction signal for increasing the driving ability by one step. The control signal generation section 113 retains the instruction signal in a retention circuit 452, and with this instruction signal, instructs the transmitter 100 to increase the driving current, via the output buffer 114 and the driving current generation circuit 117.

In other words, the output of the control circuit 103 is held in a high impedance state, and the instruction signal which has been retained in the retention circuit 452 is output via the output buffer 114 and the driving current generation circuit 117. The output from the driving current generation circuit 117 is received by the reception section 104 via the signal input/output terminal 215, the transmission line 123, and the signal input/output terminal 205. The receiver 210 retains the output buffer 114 in a high impedance state, and the control circuit 103 cancels the high impedance state.

The reception section 104 generates a control signal from the received instruction signal. The control circuit 103 drives the transmission line 121 with a driving current which is increased by one step based on the control signal, thus again outputting a signal which is based on the test pattern signal. The receiver 110 performs a process of detecting an initial voltage on the signal input terminal 115, and repeats the process until entering the range defined by the reference voltages VREF2 and VREF3. The subsequent process is the same as the process that has been described in connection with the signal transmission system 1 of Embodiment 1, and therefore the description thereof is omitted. Once the initial voltage comes into the range defined by the reference voltages VREF2 and VREF3, the process is ended because the output impedance of the control circuit 103 and the impedance of the transmission line 121 have matched. Note that, after completing the impedance adjustment, the output impedance of the driving current generation circuit 117 is retained in the high impedance state until an adjustment sequence is again performed.

Next, a procedure by which a signal is transmitted from the control signal generation section 113 to the reception section 104 via the transmission line 123 will be described.

The instruction signal which is sent out from the control signal generation section 113 must be correctly received at the reception section 104. As described above, the waveform 603 shown in FIG. 7(c) is the optimum transmission waveform, with which most fast signal transmission can be performed accurately. On the other hand, the waveforms 601 and 602 require longer time until the voltage becomes settled between the reference voltages VREF2 and VRE3 than does the waveform 603. In other words, it is slower than the signal transmission with the waveform 603. However, signal transmission can still be performed correctly. As is clear from the waveforms of FIGS. 7(a) to (c), when the output impedance is small, the time until changes in voltage become subsided also elapses fast, so that a signal can be rapidly sent. Conversely, when the output impedance is large, it is slow but there is a relatively high likelihood of being able to send a signal correctly. Note that the waveform 604 of FIG. 7(d) exhibits waveform distortion until the voltage becomes settled between the reference voltages VREF2 and VREF3. Therefore, it is clear that a signal cannot be correctly transmitted.

Now, assuming that an output impedance of the control circuit 103 that enables signal transmission with the waveform 603 shown in FIG. 7(c) is $Z_3[\Omega]$ and that output impedances which enable signal transmission with the waveforms 602 and 601 shown in FIGS. 7(b) and (a) are $Z_2[\Omega]$ and $Z_1[\Omega]$, respectively, the relationship $Z_3<Z_2<Z_1$ is satisfied.

Except during the impedance adjustment sequence, the internal circuit 101 of the transmitter 200 transmits a general data signal to the internal circuit 111 of the receiver 210. It is desirable that the data signal transmission occurs correctly and rapidly. On the other hand, the control signal generation section 113 of the receiver 210 transmits an instruction signal (control signal) to the current control signal reception section 104 of the transmitter 200. The instruction signal is transmitted via the driving current generation circuit 117 of the receiver 210. Herein, the output impedance of the driving current generation circuit 117 is not variable but fixed.

It is desirable that the instruction signal from the receiver 210 to the transmitter 200 can be transmitted accurately and rapidly by using the waveform 603 of FIG. 7(c). However, accuracy is to be regarded as more important because, if transmission of an instruction signal can be performed accurately, then it will be possible after an impedance adjustment to transmit an instruction signal by using the waveform 603 of FIG. 7(c). Therefore, in the case where it is impossible to use the waveform 603 of FIG. 7(c), it is necessary to transmit an instruction signal by using the waveform 602 shown in FIG. 7(b) or the waveform 601 shown in FIG. 7(a). Note that, in the presence of a waveform distortion such as that of the waveform 604, it is impossible to correctly transmit an instruction signal.

Assuming that the output impedance of the control circuit 103 after completing impedance adjustment is $A[\Omega]$ and that the output impedance of the driving current generation circuit 117 when transmitting control data is $B[\Omega]$, the output impedance B can be determined within a range of values where the relationship A<B is satisfied. In the case where B is relatively small, it is possible to reduce the time required for the adjustment sequence. In the case where B is relatively large, even if there is variation in the impedance of the transmission line 123 or the like, such variation can be absorbed, thus allowing for a greater margin. However, the transmission of control data will be slow. Conventionally, when rapidly transmitting a signal from the transmitter 200 to the receiver 210, it has been necessary to use an expensive wiring board or cable that has a highly precise impedance in order to conserve signal quality. However, according to the present invention, so long as accurate transmission of an instruction signal from the receiver 210 to the transmitter 200 is guaranteed, it is possible to perform an accurate and fast signal transmission even by using an inexpensive wiring board or cable.

Thus, Embodiments 1 and 2 related to the impedance matching process according to the present invention have been described. Although the present invention has been conveniently illustrated by limiting the number of transmission lines for which impedance matching is established to one, there is no limitation to one. For example, in the case where the transmission line is a plurality of buses connecting between semiconductor chips, it will be possible to execute the process for each bus.

The signal transmission system is able to switch between executing the impedance matching process of the present invention and not executing it. For example, after a transmission line is connected, if it is determined that both the transmitter and the receiver are able to execute the impedance matching process of the present invention, then the process of the present invention is performed. If it is determined that the process of the present invention cannot be performed, no impedance matching process is performed, or an impedance matching process by a conventional technique is performed. Furthermore, the transmission system may perform another predefined process.

In the description of the signal transmission systems 1 and 2 above, the transmitter and the receiver are identified in advance. However, in the case where two devices which are capable of both transmission and reception of signals, e.g., the PC and the hard disk drive of FIG. 1(*a*) are connected, it is necessary to define which one of them should be the first to establish impedance matching with the transmission line. In this case, as one parameter, the chip numbers which are kept in the semiconductor chips may be compared in terms of magnitude, and impedance matching may be performed for the one with the smaller number first.

The signal transmission system 1 has been illustrated as such that the respective communication controllers (not shown) of the transmitter and the receiver execute computer programs with which the process of the flowchart of FIG. 8 is realized by the whole system, thus controlling the aforementioned process. Although the program to be executed in the transmitter and the program to be executed in the receiver are not the same, they may be defined, within a single program, as a process routine for the transmitter and a process routine for the receiver. Each communication controller is to recognize whether it belongs to a transmitter or a receiver, and execute the necessary process routine depending on the situation. Such a computer program can be recorded on a variety of storage media, such as: a magnetic storage medium, e.g., a flexible disk; a semiconductor storage medium, e.g., a flash memory; and an optical storage medium, e.g., an optical disk, and also may be transmitted via electric communications lines, e.g., a network. Furthermore, a chip set containing one or more semiconductor recording media in which such a computer program is stored may be constructed.

According to the present invention, in a signal transmission system including a transmitter and a receiver which are connected via a transmission line, the receiver which has detected a signal from the transmitter sends to the transmitter an instruction signal for changing the current amount of the driving current based on the signal value of the detected signal. The transmitter changes the driving current based on this signal, whereby matching can be dynamically established between the output impedance of the transmitter-side driving circuit for driving the transmission line and the impedance of the transmission line. Since signal reflection and distortion due to changes in the transmission line characteristics can be eliminated by establishing impedance matching with respect to each transmission line each time a connection is made, the signal transmission system 1 can realize good and fast signal transmission.

According to the present invention, since the signal transmission characteristics of the transmission line can be adjusted, even if there is variation in the characteristics of the transmitter and the receiver (e.g., output buffer characteristics of the semiconductor integrated circuit) and variation in the characteristics of the transmission line (e.g., characteristics of the printed board wiring and the cable), it is possible to make a design so that such variations can be absorbed within the tolerable range of signal transmission characteristics. This allows for a margin in the production of the semiconductor integrated circuit, printed board, and the like, whereby the production yield can be improved.

According to the present invention, the output impedances of a transmitter and a receiver are adjusted in accordance with the impedance of the transmission line connected thereto, whereby consumption of a transient output current until enablement of signal transmission can be adjusted. By reducing the transient output current to the bear minimum, power consumption can be reduced.

INDUSTRIAL APPLICABILITY

According to the present invention, it is possible to establish impedance matching in transmitting a signal between, for example, home appliance devices which are connected via a detachable cable or between semiconductor chips which are connected via wiring on a printed board. By dynamically establishing matching between the output impedance of a driving circuit and the impedance of a transmission line, fast signal transmission is realized, and the transmission efficiency can be improved. Moreover, according to the present invention, power consumption at the time of signal transmission can be kept to the bear minimum by being adapted to the transmission line.

The invention claimed is:

1. A transmitter to be connected to a receiver via a transmission line, the transmitter composing a signal transmission system together with the receiver, the transmitter comprising:
   a communication section to be connected to a first end of the transmission line; and
   a driving current control section for driving the transmission line with a predetermined amount of driving current, the driving current control section changing current amount of the driving current based on a control signal,
   wherein, as the control signal, the communication section receives from the receiver being connected to a second end of the transmission line an instruction signal for instructing whether or not to change the current amount of the driving current, the instruction signal being generated based on whether a signal value detected at the second end of the transmission line falls within a predetermined range or not.

2. The transmitter of claim 1, wherein, if the signal value falls within the predetermined range, the communication section receives as the control signal an instruction signal instructing to stop changing the current amount of the driving current, and based on the control signal, the driving current control section retains a present setting value of the current amount of the driving current.

3. The transmitter of claim 1, wherein, if the signal value is smaller than a lower limit value of the predetermined range, the communication section receives as the control signal an instruction signal instructing to increase the driving current, and based on the control signal, the driving current control section increases the driving current.

4. The transmitter of claim 1, wherein, if the signal value is greater than an upper limit value of the predetermined range, the communication section receives as the control signal an instruction signal instructing to decrease the driving current, and based on the control signal, the driving current control section decreases the driving current.

5. The transmitter of claim 1, wherein the communication section includes a first terminal connected to the first end of the transmission line and a second terminal for being connected to a control signal line to receive the instruction signal, the control signal line being different from the transmission line.

6. The transmitter of claim 1, wherein,
   the driving current control section is capable of transmitting a signal by driving the transmission line; and
   transmission of a signal from the driving current control section and reception of the control signal are performed by time division.

7. The transmitter of claim 1, wherein an output impedance value when the driving current control section drives the transmission line is smaller than an output impedance value of the receiver outputting the instruction signal.

8. The transmitter of claim 1, wherein,
the driving current control section is capable of transmitting a signal by driving the transmission line; and
a rate with which the driving current control section transmits a signal is faster than a rate with which a signal is transmitted when the receiver outputs the instruction signal.

9. The transmitter of claim 1, wherein the transmission line is detachable from the communication section.

10. A receiver to be connected to a transmitter via a transmission line, the receiver composing a signal transmission system together with the transmitter, the transmitter being connected to a first end of the transmission line, the receiver comprising:
a communication section connected to a second end of the transmission line, the communication section receiving a signal from the transmission line being driven with a predetermined driving current;
a detection section for detecting a signal value at the second end of the transmission line based on the signal, and for generating a detection signal indicating whether the signal value falls within a predetermined range or not; and
a signal generation section for, based on the detection signal, generating an instruction signal for instructing whether or not to change current amount of the driving current, wherein
the communication section outputs the instruction signal to the transmitter.

11. The receiver of claim 10, wherein, if a detection signal indicating that the signal value falls within the predetermined range is generated by the detection section, the signal generation section generates an instruction signal instructing to stop changing the current amount of the driving current.

12. The receiver of claim 10, wherein if a detection signal indicating that the signal value is smaller than a lower limit value of the predetermined range is generated by the detection section, the signal generation section generates an instruction signal instructing to increase the driving current.

13. The receiver of claim 10, wherein if a detection signal indicating that the signal value is greater than an upper limit value of the predetermined range is generated by the detection section, the signal generation section generates an instruction signal instructing to decrease the driving current.

14. The receiver of claim 10, wherein the communication section includes a first terminal connected to the second end of the transmission line and a second terminal for being connected to a control signal line to output the instruction signal, the control signal line being different from the transmission line.

15. The receiver of claim 10, wherein,
the transmitter is capable of transmitting a signal by driving the transmission line with the predetermined driving current; and
reception of a signal from the transmission line and transmission of the instruction signal are performed by time division.

16. The receiver of claim 10, wherein an output impedance value of the transmitter driving the transmission line with the predetermined driving current is smaller than an output impedance value from the terminal portion to the signal generation section.

17. The receiver of claim 10, wherein a rate with which a signal is transmitted when the receiver outputs the instruction signal is slower than a rate with which the driving current control section transmits a signal by driving the transmission line.

18. The receiver of claim 10, wherein the transmission line is detachable from the communication section.

19. A transmitting-end interface to be used in a transmitter to be connected to a receiving-end interface of a receiver via a transmission line, the transmitter composing a signal transmission system together with the receiver, the transmitting-end interface comprising:
a communication section to be connected to a first end of the transmission line; and
a driving current control section for driving the transmission line with a predetermined amount of driving current, the driving current control section changing current amount of the driving current based on a control signal,
wherein, as the control signal, the communication section receives from the receiver being connected to a second end of the transmission line an instruction signal for instructing whether or not to change the current amount of the driving current, the instruction signal being generated based on whether a signal value detected at the second end of the transmission line falls within a predetermined range or not.

20. The transmitting-end interface of claim 19, wherein the communication section includes a first terminal connected to the first end of the transmission line and a second terminal for being connected to a control signal line to receive the instruction signal, the control signal line being different from the transmission line.

21. The transmitting-end interface of claim 19, wherein,
the driving current control section is capable of transmitting a signal by driving the transmission line; and
transmission of a signal from the driving current control section and reception of the control signal are performed by time division.

22. The transmitting-end interface of claim 19, wherein an output impedance value when the driving current control section drives the transmission line is smaller than an output impedance value of the receiver outputting the instruction signal.

23. The transmitting-end interface of claim 19, wherein,
the driving current control section is capable of transmitting a signal by driving the transmission line; and
a rate with which the driving current control section transmits a signal is faster than a rate with which a signal is transmitted when the receiver outputs the instruction signal.

24. A receiving-end interface to be used in a receiver to be connected to a transmitting-end interface of a transmitter via a transmission line, the receiver composing a signal transmission system together with the transmitter, the transmitting-end interface being connected to a first end of the transmission line, the receiving-end interface comprising:
a communication section connected to a second end of the transmission line, the communication section receiving a signal from the transmission line being driven with a predetermined driving current;
a detection section for detecting a signal value at the second end of the transmission line based on the signal received at the communication section, and for generating a detection signal indicating whether the signal value falls within a predetermined range or not; and a signal generation section for, based on the detection signal, generating an instruction signal for instructing whether or not to change current amount of the driving current, wherein the communication section outputs the instruction signal to the transmitter.

25. The receiving-end interface of claim 24, wherein the communication section includes a first terminal connected to the second end of the transmission line and a second terminal for being connected to a control signal line to output the instruction signal, the control signal line being different from the transmission line.

26. The receiving-end interface of claim 24, wherein,
the transmitter is capable of transmitting a signal by driving the transmission line with the predetermined driving current; and
reception of a signal from the transmission line and transmission of the instruction signal are performed by time division.

27. The receiving-end interface of claim 24, wherein an output impedance value of the transmitter driving the transmission line with the predetermined driving current is smaller than an output impedance value from the terminal portion to the signal generation section.

28. The receiving-end interface of claim 24, wherein a rate with which a signal is transmitted when the receiving-end interface outputs the instruction signal is slower than a rate with which the driving current control section transmits a signal by driving the transmission line.

29. An interface system comprising a transmitting-end interface to be used in a transmitter and a receiving-end interface to be used in a receiver, the transmitting-end interface and the receiving-end interface being connected via a transmission line, the transmitter and the receiver composing a signal transmission system,
wherein the transmitting-end interface comprises:
a communication section to be connected to a first end of the transmission line; and
a driving current control section for driving the transmission line with a predetermined amount of driving current, the driving current control section changing current amount of the driving current based on a control signal,
wherein the receiving-end interface comprises:
a communication section connected to a second end of the transmission line, the communication section receiving a signal from the transmission line being driven with the predetermined amount of driving current;
a detection section for detecting a signal value at the second end of the transmission line based on the signal received at the communication section, and for generating a detection signal indicating whether the signal value falls within a predetermined range or not; and
a signal generation section for, based on the detection signal, generating an instruction signal for instructing whether or not to change current amount of the driving current, the instruction signal being generated based on whether a signal value detected at the second end of the transmission line falls within a predetermined range or not, the instruction signal to be output by the communication section of the receiving-end interface, and
wherein, as the control signal, the communication section of the transmitting-end interface receives from the receiver the instruction signal.

30. A transmitting-end chip to be connected to a receiving-end chip via a transmission line, the transmitting-end chip composing a signal transmission system together with the receiving-end chip, the transmitting-end chip comprising:
a communication section to be connected to a first end of the transmission line; and
a driving current control section for driving the transmission line with a predetermined amount of driving current, the driving current control section changing current amount of the driving current based on a control signal,
wherein, as the control signal, the communication section receives from the receiver being connected to a second end of the transmission line an instruction signal for instructing whether or not to change the current amount of the driving current, the instruction signal being generated based on whether a signal value detected at the second end of the transmission line falls within a predetermined range or not.

31. The transmitting-end chip of claim 30, wherein the communication section includes a first terminal connected to the first end of the transmission line and a second terminal for being connected to a control signal line to receive the instruction signal, the control signal line being different from the transmission line.

32. The transmitting-end chip of claim 30, wherein,
the driving current control section is capable of transmitting a signal by driving the transmission line; and
transmission of a signal from the driving current control section and reception of the control signal are performed by time division.

33. The transmitting-end chip of claim 30, wherein an output impedance value when the driving current control section drives the transmission line is smaller than an output impedance value of the receiver outputting the instruction signal.

34. The transmitting-end chip of claim 30, wherein,
the driving current control section is capable of transmitting a signal by driving the transmission line; and
a rate with which the driving current control section transmits a signal is faster than a rate with which a signal is transmitted when the receiver outputs the instruction signal.

35. A receiving-end chip to be connected to a transmitting-end chip via a transmission line, the receiving-end chip composing a signal transmission system together with the transmitting-end chip, the transmitting-end chip being connected to a first end of the transmission line, the receiving-end chip comprising:
a communication section connected to a second end of the transmission line, the communication section receiving a signal from the transmission line being driven with a predetermined driving current;
a detection section for detecting a signal value at the second end of the transmission line based on the signal, and for generating a detection signal indicating whether the signal value falls within a predetermined range or not; and
a signal generation section for, based on the detection signal received at the communication section, generating an instruction signal for instructing whether or not to change current amount of the driving current, wherein
the communication section outputs the instruction signal to the transmitter.

36. The receiving-end chip of claim 35, wherein the communication section includes a first terminal connected to the second end of the transmission line and a second terminal for being connected to a control signal line to output the instruction signal, the control signal line being different from the transmission line.

37. The receiving-end chip of claim 35, wherein,
the transmitter is capable of transmitting a signal by driving the transmission line with the predetermined driving current; and
reception of a signal from the transmission line and transmission of the instruction signal are performed by time division.

38. The receiving-end chip of claim 35, wherein an output impedance value of the transmitter driving the transmission line with the predetermined driving current is smaller than an output impedance value from the terminal portion to the signal generation section.

39. The receiving-end chip of claim 35, wherein a rate with which a signal is transmitted when the receiving-end chip outputs the instruction signal is slower than a rate with which the driving current control section transmits a signal by driving the transmission line.

40. A chip-mounted board comprising a transmitting-end chip of and a receiving-end chip, the transmitting-end chip and the receiving-end chip being connected via the transmission line,
wherein the transmitting-end chip comprises:
a communication section to be connected to a first end of the transmission line; and
a driving current control section for driving the transmission line with a predetermined amount of driving current, the driving current control section changing current amount of the driving current based on a control signal,
wherein the receiving-end chip comprises:
a communication section connected to a second end of the transmission line, the communication section receiving a signal from the transmission line being driven with the predetermined amount of driving current;
a detection section for detecting a signal value at the second end of the transmission line based on the signal, and for generating a detection signal indicating whether the signal value falls within a predetermined range or not; and
a signal generation section for, based on the detection signal, generating an instruction signal for instructing whether or not to change current amount of the driving current, the instruction signal being generated based on whether a signal value detected at the second end of the transmission line falls within a predetermined range or not, the instruction signal to be output by the communication section of the receiving-end chip, and
wherein, as the control signal, the communication section of the transmitting-end chip receives from the receiving-end chip the instruction signal.

41. An impedance matching method for setting an output impedance of a transmitter which is connected to a receiver via a transmission line and composes a signal transmission system together with the receiver, the transmitter including: a communication section to be connected to a first end of the transmission line; and a driving current control section for driving the transmission line, the receiver being connected to a second end of the transmission line,
the method comprising the steps of:
operating the driving current control section to drive the transmission line with a predetermined amount of driving current;
receiving, as a control signal for instructing whether or not to change the current amount of the driving current, an instruction signal generated based on whether a signal value detected at the second end of the transmission line falls within a predetermined range or not; and
changing the current amount of the driving current based on the control signal.

42. The impedance matching method of claim 41, wherein,
the communication section includes a first terminal connected to the first end of the transmission line and a second terminal connected to a control signal line, the control signal line being different from the transmission line; and
the step of receiving receives the instruction signal at the second terminal.

43. The impedance matching method of claim 41, wherein,
the step of driving operates the driving current control section to transmit a signal by driving the transmission line, and wherein
the method further comprises a step of performing, by time division, transmission of a signal from the driving current control section and reception of the control signal.

44. The impedance matching method of claim 41, wherein an output impedance value when the driving current control section drives the transmission line is smaller than an output impedance value of the receiver outputting the instruction signal.

45. The impedance matching method of claim 41, wherein,
the step of driving operates the driving current control section to transmit a signal by driving the transmission line; and
a rate with which the driving current control section transmits a signal is faster than a rate with which a signal is transmitted when the receiver outputs the instruction signal.

46. An output impedance setting assisting method for, in a receiver which is connected to a transmitter via a transmission line and composes a signal transmission system together with the transmitter, assisting in setting an output impedance of the transmitter, the transmitter being connected to a first end of the transmission line, the receiver including: a communication section connected to a second end of the transmission line; and a detection section for detecting a signal value at a predetermined position,
the method comprising the steps of:
receiving, via the communication section, a signal from the transmission line being driven with a predetermined driving current;
detecting, by using the detection section, a signal value at the second end of the transmission line based on the signal;
generating a detection signal indicating whether the signal value falls within a predetermined range or not;
based on the detection signal, determining whether or not to change the current amount of the driving current with which the transmission line is driven;
generating an instruction signal indicating the result of determination; and
outputting the instruction signal to the transmitter via the communication section.

47. The output impedance setting assisting method of claim 46, wherein,
the communication section includes a first terminal connected to the second end of the transmission line and a second terminal connected to a control signal line, the control signal line being different from the transmission line; and the step of receiving receives the instruction signal at the second terminal.

48. The output impedance setting assisting method of claim 46, wherein,
the transmitter is capable of transmitting a signal by driving the transmission line with the predetermined driving current, and wherein
the method further comprises a step of performing, by time division, reception of a signal from the transmission line and transmission of the instruction signal.

49. The output impedance setting assisting method of claim 46, wherein an output impedance value of the transmitter driving the transmission line with the predetermined driving current is smaller than an output impedance value from the terminal portion to the signal generation section.

50. The output impedance setting assisting method of claim 46, wherein a rate with which a signal is transmitted when the receiver outputs the instruction signal is slower than a rate with which the driving current control section transmits a signal by driving the transmission line.

51. A product of a computer program, the computer program to be executed in a transmitter which is connected to a receiver via a transmission line and composes a signal transmission system together with the receiver, the transmitter including: a communication section to be connected to a first end of the transmission line; and a driving current control section for driving the transmission line, the receiver being connected to a second end of the transmission line,
the computer program comprising the steps of:
operating the driving current control section to drive the transmission line with a predetermined amount of driving current;
causing the communication section to receive, as a control signal for instructing whether or not to change the current amount of the driving current, an instruction signal generated at the receiver based on whether a signal value detected at the second end of the transmission line falls within a predetermined range or not; and
changing the current amount of the driving current based on the control signal.

52. The product of a computer program of claim 51, wherein,
the communication section includes a first terminal connected to the first end of the transmission line and a second terminal connected to a control signal line, the control signal line being different from the transmission line; and
the instruction signal is received at the second terminal.

53. The product of a computer program of claim 51, wherein,
the driving current control section is capable of transmitting a signal by driving the transmission line, and
the transmitter is caused to perform, by time division, transmission of a signal from the driving current control section and reception of the control signal.

54. The product of a computer program of claim 51, wherein an output impedance value when the driving current control section drives the transmission line is smaller than an output impedance value of the receiver outputting the instruction signal.

55. The product of a computer program of claim 51, wherein,
the driving current control section is capable of transmitting a signal by driving the transmission line; and
a rate with which the driving current control section transmits a signal is faster than a rate with which a signal is transmitted when the receiver outputs the instruction signal.

56. A product of a computer program, the computer program to be executed in a receiver which is connected to a transmitter via a transmission line and composes a signal transmission system together with the transmitter, the transmitter being connected to a first end of the transmission line, the receiver including: a communication section connected to a second end of the transmission line; and a detection section for detecting a signal value at a predetermined position,
the computer program comprising the steps of:
receiving, via the communication section, a signal from the transmission line being driven with a predetermined driving current;
detecting, by using the detection section, a signal value at the second end of the transmission line based on the signal;
generating a detection signal indicating whether the signal value falls within a predetermined range or not;
based on the detection signal, determining whether or not to change the current amount of the driving current with which the transmission line is driven;
generating an instruction signal indicating the result of determination; and
outputting the instruction signal to the transmitter via the communication section.

57. The product of a computer program of claim 56, wherein,
the communication section includes a first terminal connected to the second end of the transmission line and a second terminal connected to a control signal line, the control signal line being different from the transmission line; and
the instruction signal is received at the second terminal.

58. The product of a computer program of claim 56, wherein,
the transmitter is capable of transmitting a signal by driving the transmission line with the predetermined driving current, and
the receiver is caused to perform, by time division, reception of a signal from the transmission line and transmission of the instruction signal.

59. The product of a computer program of claim 56, wherein an output impedance value of the transmitter driving the transmission line with the predetermined driving current is smaller than an output impedance value from the terminal portion to the signal generation section.

60. The product of a computer program of claim 56, wherein a rate with which a signal is transmitted when the receiver outputs the instruction signal is slower than a rate with which the driving current control section transmits a signal by driving the transmission line.

* * * * *